United States Patent

Hosokai et al.

[11] Patent Number: 5,909,247
[45] Date of Patent: Jun. 1, 1999

[54] SOLID-STATE IMAGE PICKUP APPARATUS

[75] Inventors: Shigeru Hosokai; Tetsuo Nomoto, both of Tatsuno-machi; Shinichi Nakajima, Hachioji, all of Japan

[73] Assignee: Olympus Optical Co., Ltd., Tokyo, Japan

[21] Appl. No.: 08/752,601

[22] Filed: Nov. 19, 1996

[30] Foreign Application Priority Data

Dec. 5, 1995 [JP] Japan .................................. 7-339936
Dec. 11, 1995 [JP] Japan .................................. 7-345460

[51] Int. Cl.$^6$ .......................... H04N 5/335; G11C 19/00; G09G 5/00
[52] U.S. Cl. .................... 348/302; 348/305; 348/324; 377/54; 377/77; 377/78; 345/197; 345/198
[58] Field of Search ..................... 348/302, 303, 348/304, 305, 311, 312, 317, 320, 322, 324; 377/54, 77, 78; 345/197, 198; 364/724.1

[56] References Cited

U.S. PATENT DOCUMENTS

| | | | |
|---|---|---|---|
| 4,799,109 | 1/1989 | Esser et al. | 348/324 |
| 4,816,918 | 3/1989 | McGrath | 348/324 |
| 4,879,601 | 11/1989 | Buck et al. | 348/220 |
| 4,975,932 | 12/1990 | Matsushima et al. | 377/81 |
| 4,982,353 | 1/1991 | Jacob et al. | 364/724.1 |
| 5,128,974 | 7/1992 | Maekawa | 377/81 |
| 5,227,790 | 7/1993 | Shin et al. | 341/100 |

Primary Examiner—Wendy Garber
Assistant Examiner—Andrew B. Christensen
Attorney, Agent, or Firm—Armstrong, Westerman, Hattori, McLeland & Naughton

[57] ABSTRACT

An XY-address solid-state image pickup apparatus comprises a pixel array made up a plurality of pixels two-dimensionally arranged and horizontal and vertical scanning circuits for reading the signal from the pixel array. Each scanning circuit comprises a plurality of unit stages cascaded, each unit stage comprising a plurality of first shift register units cascaded and a single second shift register unit which is associated with the plurality of first shift register units and which is driven by a clock different from the clock that drives the plurality of first shift register units. Each unit stage further comprises a first switch and a second switch. The input to the first unit of the first shift register units is also fed to the second shift register unit via the first switch. The output of the second shift register unit is fed to each of the plurality of first register units within the unit stage via the second switch. Each scanning circuit further comprises driving means for turning on/off the first and second switches in order to switch between a normal scanning and a thinned-out scanning.

11 Claims, 21 Drawing Sheets

FIG.15

41: PIXEL ARRAY
43: OB PIXEL
42: LIGHT RECEIVING PIXEL

FIG.17

| (10,1) | (10,2) | (10,3) | (10,4) | (10,5) | (10,6) |
|---|---|---|---|---|---|
| (9,1) | (9,2) | (9,3) | (9,4) | (9,5) | (9,6) |
| (8,1) | (8,2) | (8,3) | (8,4) | (8,5) | (8,6) |
| (7,1) | (7,2) | (7,3) | (7,4) | (7,5) | (7,6) |
| (6,1) | (6,2) | (6,3) | (6,4) | (6,5) | (6,6) |
| (5,1) | (5,2) | (5,3) | (5,4) | (5,5) | (5,6) |
| (4,1) | (4,2) | (4,3) | (4,4) | (4,5) | (4,6) |
| (3,1) | (3,2) | (3,3) | (3,4) | (3,5) | (3,6) |
| (2,1) | (2,2) | (2,3) | (2,4) | (2,5) | (2,6) |
| (1,1) | (1,2) | (1,3) | (1,4) | (1,5) | (1,6) |

52: LIGHT RECEIVING PIXEL
53: OB PIXEL
51: PIXEL ARRAY

SOLID-STATE IMAGE PICKUP APPARATUS

BACKGROUND OF THE INVENTION

1. Field of the Invention

The present invention relates to an XY address solid-state image pickup apparatus having a pixel array made up a plurality of pixels two-dimensionally arranged and, more particularly, to an XY address solid-state image pickup apparatus having a scanning circuit that may perform a thinned-out scanning with one out of every arbitrary number of stages or an arbitrary number of stages as a unit.

2. Description of the Related Art

In known XY address solid-state image pickup apparatuses having a pixel array made up a plurality of pixels two-dimensionally arranged, horizontal and vertical scanning circuits for sequentially selecting a pixel employ a shift register. Known as one type of such shift register is a clocked CMOS shift register that is constructed by cascading clocked inverters. FIG. 1 shows the construction of such a shift register. Shown in FIG. 1 are first clocked inverters 100-1 and second clocked inverters 100-2, and one first clocked inverter 100-I and one second clocked inverter 100-2 are cascaded to form a shift register unit 101. A number of shift register units 101 are again cascaded to form a shift register. Each shift register unit 101 inverts an input signal φ ST at the timings of the clock pulses φ 1 and φ 2, and multiple stages of such shift register units 101 function as a shift register Referring to the timing diagram in FIG. 2, the operation of the shift register in FIG. 1 is now discussed. At time $t_{ST}$, the input signal φ ST is driven and remains high level for a duration of one period of the clock φ1. When the clock φ2 is high level, the first clocked inverters 100-1 become active, and data at nodes SR 0.0, SR 1.0, SR 2.0, SR 3.0, SR 4.0, SR 5.0, SR 6.0, and SR 7.0 are inverted and then shifted to SR 0.5, SR 1.5, SR 2.5, SR 3.5, SR 4.5, SR 5.5, SR 6.5 and SR 7.5, respectively, When the clock φ 1 is high level, the second clocked inverters 100-2 become active, data at nodes R 0.5, SR 1,5, SR 2.5, SR 3.5, SR 4.5, SR 5.5, SR 6.5 and SR 7.5 are inverted and shifted to SR 100, SR 2.0, SR 3.0, SR 4.0, SR 5.0, SR 6.0, SR 7.0 and SR 8.0, respectively. At times $t_{o1}$, $t_{o2}$, $t_{o3}$, $t_{o4}$, $t_{o5}$, $t_{o6}$, $t_{o7}$, and $t_{o8}$, a high level thus appears at nodes SR 1.0, SR, 2.0, SR 3.0, SR 4.0, SR 5.0, SR 6.0, SR 7.0 and SR 8.0, respectively. This high level signal is used as a selection signal output by the scanning circuit in the solid-state image pickup apparatus, and the pixels are thus sequentially selected to read out pixel signals.

In the scanning circuit of the solid-state image pickup device constructed of such a shift register, after the input signal φ ST is input to the shift register at each scan cycle, a fast clock and standard clock are alternately input to drive the shift register, and a selection signal is output every predetermined number of stages to perform a thinned-out scanning by not using the output signal from a fast clock input section as a selection signal. In the thinned-out scanning, the selection signal is output every predetermined number of stages.

This operation is discussed referring to the timing diagram in FIG. 3. At time $t_{ST}$, an input signal φ ST having a high level for a duration of one period of a clock φ 1 is input to node SR 0.0. The subsequent operation of the shift register is similar to that of FIG. 2. In this thinned-out scanning operation, however, the periods of the clocks φ 1 and φ 2 of $t_{S1}$ to $t_{S2}$, $t_{S3}$ to $t_{S4}$, $t_{S5}$ to $t_{S6}$, and $t_{S7}$ to $t_{S8}$ are set be shorter than those of $t_{ST}$ to $t_{S1}$, $t_{S2}$ to $t_{S3}$, $t_{S4}$ to $t_{S5}$, and $t_6$ to $t_7$. The high level signals appearing at nodes SR 1.0, SR 3.0, SR 5.0, and SR 7.0 for durations of $t_{S1}$ to $t_{S2}$, $t_{S3}$ to $t_{S4}$, $t_{S5}$ to $t_{S6}$, and $t_{S7}$ to $t_{S8}$, respectively, are not used as the selection signals. The high level signals appearing at each of the nodes SR 2.0, SR 4.0, SR 6.0 and SR 8.0 are used as the selection signals output from the scanning circuit in the solid-state image pickup device, Thus, the thinned-out scanning is possible. In the thinned-out scanning described herein the scanning is performed every two pixels. By introducing a plurality of short periods into the clocks φ 1 and φ 2, the thinned-out signal that allows the apparatus to scan every predetermined number of pixels is obtained.

When the thinned-out scanning is achieved according to the method illustrated in the timing diagram in FIG. 3, the period of the driving clock of the shift register needs to be varied. Varying the period of the driving clock requires a complex control process. As the number of stages of the shift register increases, the load that the clock drives increases. An increased load along with an increased power consumption as a result of a high clock frequency gives rise to problems such as heat generation

SUMMARY OF THE INVENTION

The present invention has been developed to resolve the above problems associated with the shift register for the thinned-out scanning, and it is an object of the present invention to provide a solid-state image pickup apparatus which performs the thinned-out scanning without increasing power consumption while dispensing with a complex controlling of a driving clock.

The XY-address solid-state image pickup apparatus of the present invention comprises a pixel array made up a plurality of pixels two-dimensionally arranged and horizontal and vertical scanning circuits for reading the signal from the pixel array, each scanning circuit comprising a plurality of unit stages cascaded, each unit stage comprising a plurality of first shift register units cascaded and a single second shift register unit which is associated with the plurality of first shift register units and which is driven by a clock different from the clock that drives the plurality of first shift register units, each unit stage comprising a first switch and a second switch, whereby the input to the first unit of the first shift register units is also fed to the second shift register unit via the first switch, and the output of the second shift register unit is fed to each of the plurality of first register units within said unit stage via the second switch, and each scanning circuit further comprising driving means for turning on/off the first and second switches in order to switch between a normal scanning and a thinned-out scanning.

In the above arrangement, the complex controlling of the driving clock is dispensed with, and the pixels are selected by a unit of desired number of pixels. A solid-state image pickup apparatus that performs the thinned-out scanning in an easy manner is thus provided It is another object of the present invention to provide a solid-state image pickup apparatus which performs the thinned-out scanning with its simple structure without the switches while dispensing with a complex controlling of a driving clock.

The XY-address solid-state image pickup apparatus of the present invention comprises a pixel array made up a plurality of pixels two-dimensionally arranged and horizontal and vertical scanning circuits for reading the signal from the pixel array, each scanning circuit comprising a plurality of unit stages cascaded, each unit stage comprising a plurality of first shift register units cascaded and a single second shift register unit which is associated with the plurality of first shift register units and which is driven by a clock different from the clock that drives the plurality of first shift register units, each first shift register unit being constructed of a first clocked inverter and a second clocked inverter cascaded and the single second shift register unit being constructed of a single clocked inverter whereby the input to the first unit of the first shift register units is also fed to the second shift register unit, and the output of the second shift register unit is fed to each of the second clocked inverters in the plurality of first shift register units within said unit stage, and each scanning circuit further comprising driving means for driving active or inactive each clocked inverter in the first and second shift register units in order to switch between the normal scanning and the thinned-out scanning.

Since, in this arrangement, the clocked inverters that constitute the first and second shift register units have a switching function, the switches for the thinned-out scanning can be dispensed with. A solid-state image pickup apparatus of a simple construction is thus provided.

It is yet another object of the present invention to provide a solid-state image pickup apparatus that performs the thinned-out scanning without shortening the read time of light shielding pixels when the thinned-out scanning is implemented in the solid-state image pickup apparatus equipped with the light shielding pixels.

According to the present invention, the above object is achieved by arranging light shielding pixels more than those required for normal scanning mode in the pixel array, at least in part of its peripheral portion.

BRIEF DESCRIPTION OF THE DRAWINGS

FIG. 15 shows the organization of the pixel array of an embodiment 7 of the present invention.

FIG. 17 shows the organization of the pixel array in an embodiment 8 of the present invention.

DESCRIPTION OF THE PREFERRED EMBODIMENTS

Figure 4:
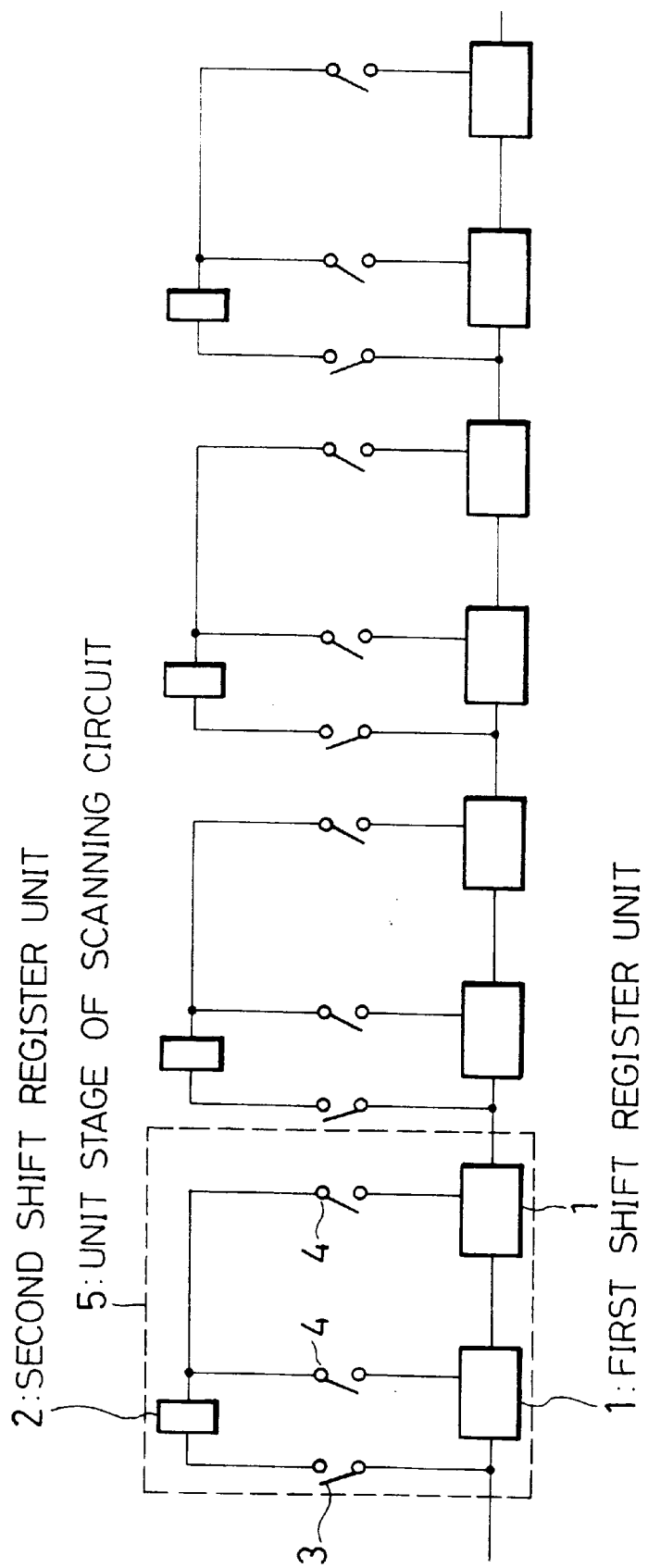
FIG. 4 is a diagram showing the concept of the scanning circuit in an embodiment 1 of the solid-state image pickup apparatus of the present invention.

Referring to the drawings, embodiments of the present invention are now discussed. FIG. 4 shows the concept of the scanning circuit according to the embodiment 1 of the solid-state image pickup apparatus. There are shown first shift register units 19 second shift register unit 2, first switch 3, second switches 4, and unit stages 5 of the scanning circuit. A plurality of unit stages 5 are cascaded to form the scanning circuit. In each unit stage 5, two first shift register units are cascaded, the input terminal of the first stage of two first shift register units 1 cascaded is connected to the input terminal of the second shift register unit 2 via the first switch 3, and the output terminal of the second shift register unit 2 is connected to the first and second stages of the two first shift register units 1 via the second switch 4 respectively.

In the scanning circuit thus constructed, by turning the first and second switches 3 and 4 off, the first shift register units 1 and the second shift register unit 2 are disconnected from each other. Only the first shift register units 1 cascaded remain operative, allowing the scanning circuit to operate in the normal shift register mode.

In the thinned-out scanning mode, the first and second switches 3 and 4 are turned on, The signal applied to the input terminal of the first stage of the two first shift register units 1 in each unit stage is concurrently fed to the first and second stages of the first shift register units 1 via the second shift register unit 20 Thus, two stages of the first shift register units 1 in the same unit stage 5 give the same output signal In the scanning circuit of this embodiment, two stages of first shift register units 1 constituting a unit stage operate concurrently as a unit. In the discussion of the present invention, both the scanning in this embodiment and scanning at a unit stage out of every predetermined number of unit stages are collectively called the thinned-out scanning.

In this embodiment, each unit stage of the scanning circuit is constructed of two first shift register units 1 cascaded and a second shift register unit 2 associated with the first shift register units 1. Alternatively, a unit stage of the scanning circuit may be constructed of a single second shift register unit 2 associated with a desired number of stages of first shift register units 1 so that the desired number of stages of first shift register units 1 operate as a unit.

Figure 5:
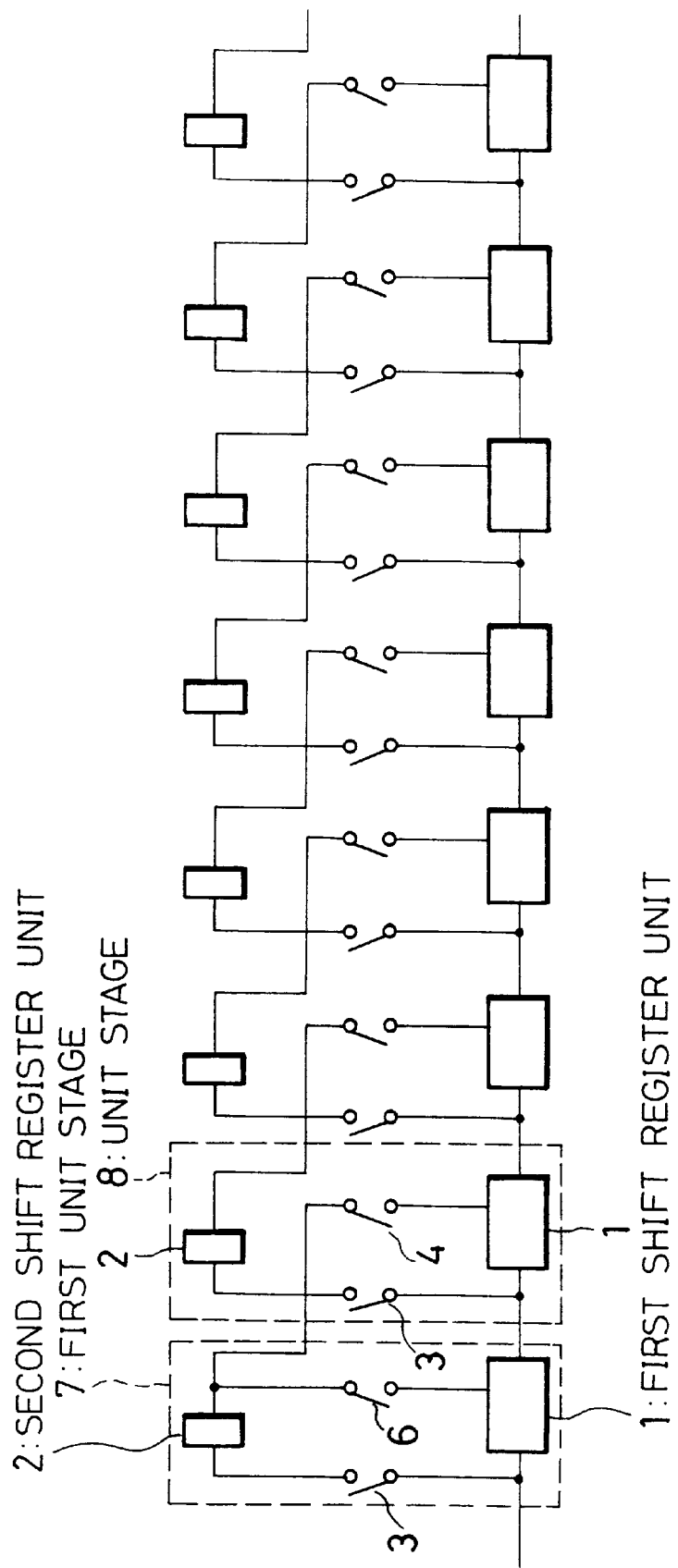
FIG. 5 is a diagram showing the concept of the scanning circuit in an embodiment 2 of the present invention.

FIG. 5 shows the concept of the embodiment 2 of the present invention In FIG. 5, components equivalent to those with reference to the embodiment 1 in FIG. 4 are designated with the same reference numerals. There are shown a first stage switch 6, a first unit stage 7 of the scanning circuit, and second and subsequent rightward (rearward) unit stages 8. In the first unit stage 7, the input terminal of the first shift register unit 1 is connected to the input terminal of the second shift register unit 2 via the first switch 3, and the output terminal of the second shift register unit 2 is connected to the first shift register unit 1 and another first shift register unit 1 at the subsequent rightward unit stage 8 via the first stage switch 6 and the second switch 4, respectively. In each of the second and subsequent rightward unit stages 8, the input terminal of the first shift register unit 1 is connected to the input terminal of the second shift register unit 2 via the first switch 3, and the output terminal of the second shift register unit 2 is connected to the first shift register unit 1 at the subsequent rightward unit stage 8 via the second switch 4. The shift register units 1 at the first unit stage 7 and subsequent rightward unit stages 8 are cascaded to form the scanning circuit.

In the scanning circuit thus constructed, by turning off the first and second switches 3 and 4 and first stage switch 6, the first shift register units 1 and the second shift register units 2 are disconnected from each other. Only the first shift register units 1 cascaded remain operative, allowing the scanning circuit to operate in the normal shift register mode.

In the thinned-out scanning mode, the first and second switches 3 and 4 and first stage switch 6 are turned on. The signal fed to the input terminal of the first shift register unit 1 at the first unit stage 7 is concurrently fed to the first shift register units 1 at the first unit stage 7 and the second unit stage 8 via the second shift register unit 2. The signal fed to the input terminal of the first shift register unit 1 at an n-th unit stage 8 is fed to the first shift register unit 1 at an (n+1)-th unit stage 8 via the second shift register unit 2. During a single shift register operation cycle, the signal fed to the first shift register unit 1 is fed to the subsequent first shift register unit 1 at the subsequent rightward unit stage. Since the arrangement of the first unit stage 7 allows an identical signal to be fed to the output terminals of first shift register units 1 at the first unit stage 7 and subsequent rightward unit stage 8, the shift register operation is carried out with two unit stages as a unit in the thinned-out scanning.

In this embodiment, the output of the second shift register unit 2 associated with the first shift register unit 1 is fed to the first shift register unit 1 at the subsequent rightward (rearward) unit stage via the second switch 4. Alternatively, the output of the second shift register unit 2 may be fed to the first shift register unit 1 at a subsequent unit stage that is positioned rightward (rearward) by a predetermined number of unit stages via the second switch 4 so that the shift register operates with a desired number of unit stages as a unit.

Figure 6:
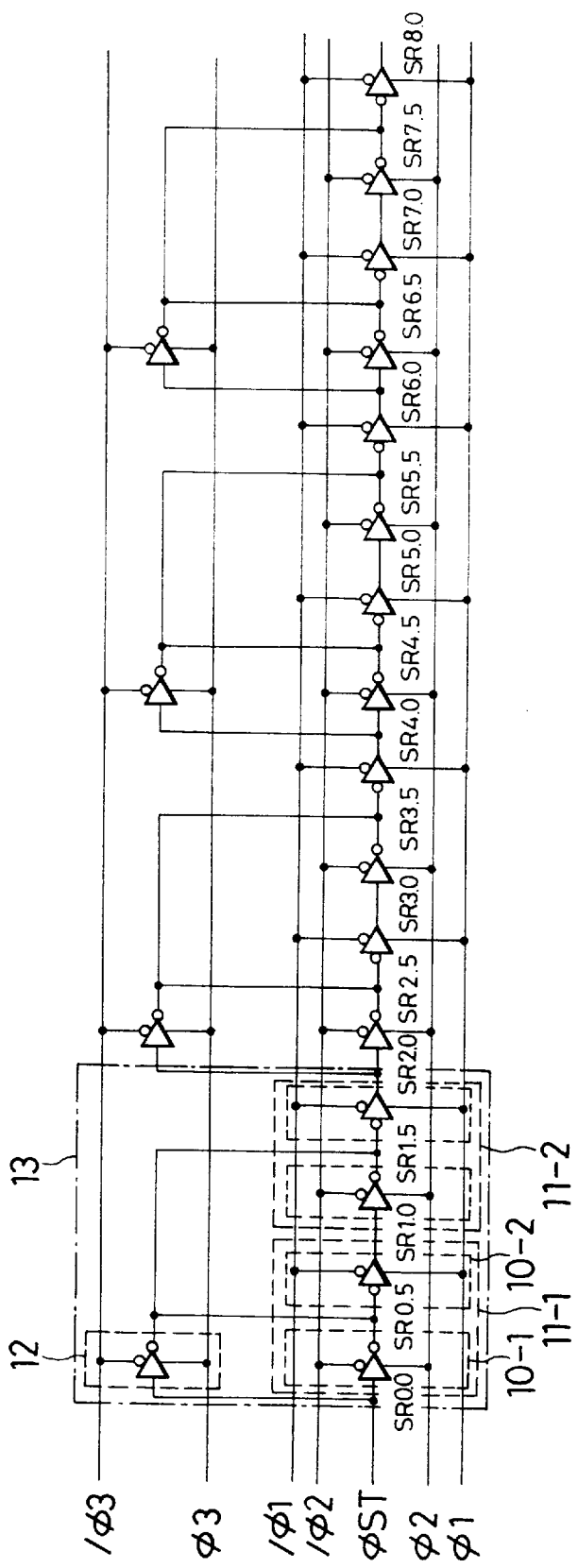
FIG. 6 is a schematic diagram showing the construction of the scanning circuit in an embodiment 3 of the present invention

Referring to FIG. 6, a specific arrangement of the embodiment 1, which is referred to as the embodiment 3, is discussed. There are shown first clocked inverters 10-1, second clocked inverters 10-2, a first stage of first shift register units 11-1 constructed of a first clocked inverter 10-1 and a second clocked inverter 10-2, a second stage of first shift register units 11-2 constructed of a first clocked inverter 10-1 and a second clocked inverter 10-2, third clocked inverter 12 and unit stages 13 of the scanning circuit. The first and second stages of the first shift register units 11-1 and 11-2 correspond to the two stages of the first shift register units 1 and 1 in the embodiment 1 and the third clocked inverter 12 corresponds to the second shift register unit 2 in the embodiment 1.

Each unit stage 13 of the scanning circuit is constructed of the first and second stages of first shift register units 11-1 and 11-2 cascaded, each constructed of a first clocked inverter 10-1 and a second clocked inverter 10-2 cascaded The input terminal of the first stage of first shift register units 11-1 is connected to the input terminal of the third clocked inverter 12, and the output terminal of the third clocked inverter 12 is connected to each of the input terminals of the second clocked inverters 10-2 of the first and second stages of the shift register units 11-1 and 11-2. A plurality of unit stages 13 are cascaded to form the scanning circuit.

Figure 7:
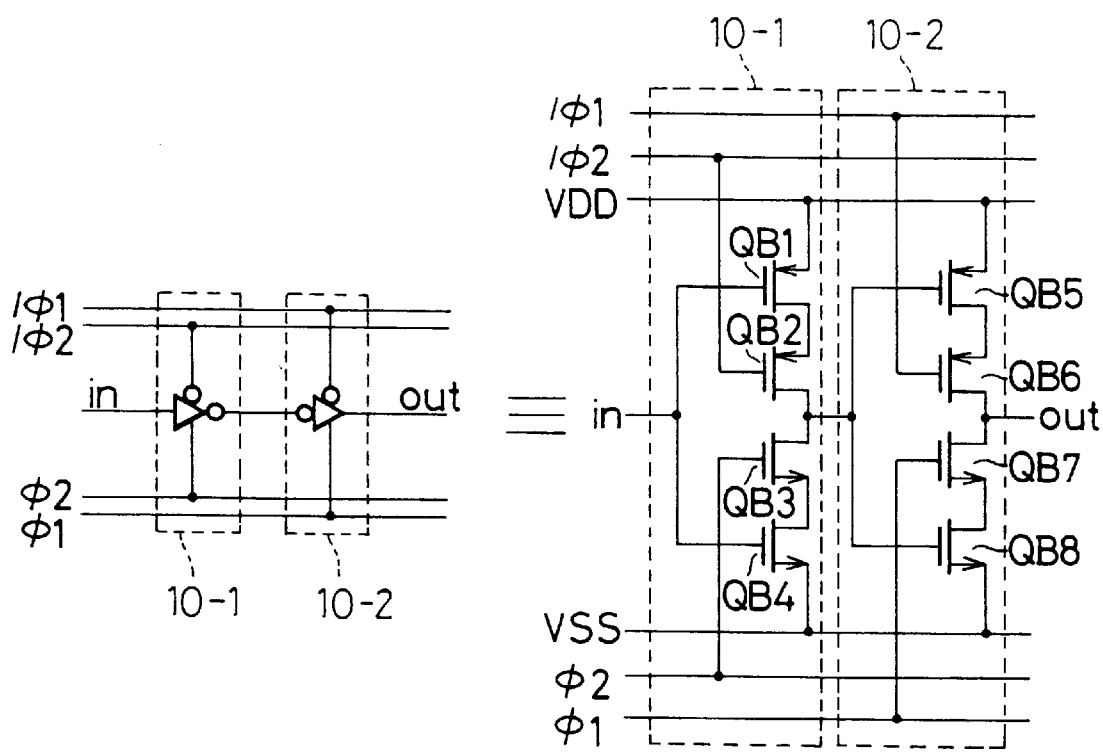
FIG. 7 is a schematic diagram showing the construction of the first shift register unit used in the scanning circuit in FIG. 6.

FIG. 7 shows the detailed schematic diagram of the first shift register units 11-1 and 11-2 in FIG. 6. The first clocked inverter 10-1 constituting the shift register unit is constructed of p-channel MOS transistors QB1 and QB2, and n-channel MOS transistors QB3 and QB4 connected in series between VDD and VSS with the gates of QB 1 and QB4 serving as an input terminal and with the drains of QB2 and QB3 serving as an output terminal. A clock $/\phi$ 2 (inverted $\phi$ 2) is fed to the gate of the MOS transistor QB2 and a clock $\phi2$ is fed to the gate of the MOS transistor QB3. As shown in FIG. 7, in the same way as the first clocked inverter 10-1, the second clocked inverter 10-2 is constructed of p-channel MOS transistors QB5 and QB6, and n-channel MOS transistors QB7 and QB8, with the clock $/\phi$ 1 (inverted $\phi$ 1) fed to the gate of the MOS transistor QB6 and the clock $\phi$ 1 fed to the gate of the MOS transistor QB7.

The first and second clocked inverters 10-1 and 10-2 are driven active by high levels of the clocks $\phi$ 2 and $\phi$ 1, respectively. The third clocked inverter 12 is driven active when a clock $\phi$ 3 is high level. The embodiment 3 is not provided with components equivalent to the first and second switches for the thinned-out scanning used in the embodiment 1 in FIG. 4. In its inactive state, the clocked inverter has a large output impedance, isolating its output terminal from its input terminal, and thus functioning as a switch as well. In the embodiment shown in FIG. 6, four unit stages are cascaded to form the scanning circuit.

Figure 8:
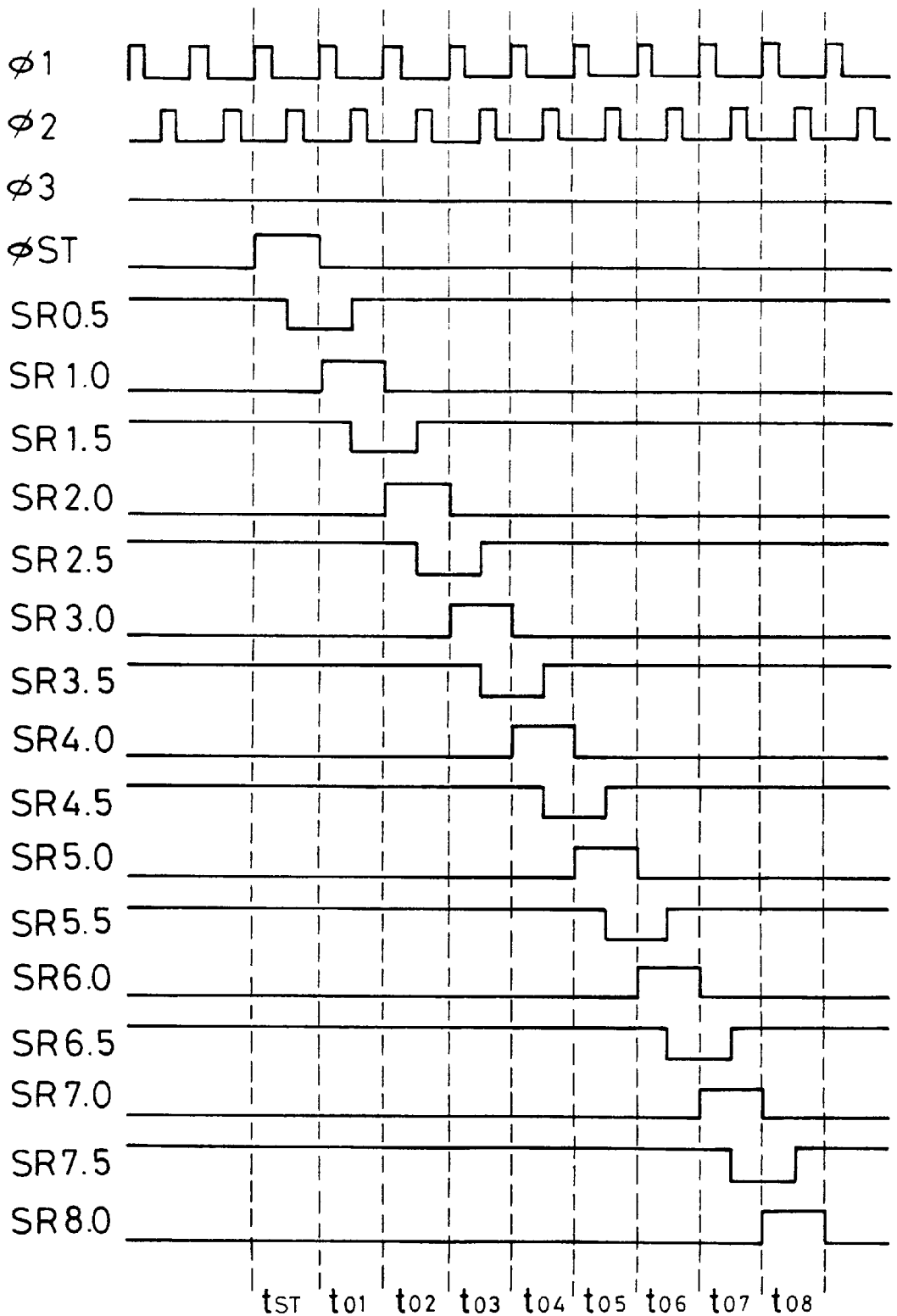
FIG. 8 is a timing diagram illustrating the operation of the scanning circuit of FIG. 6 in its normal scanning mode.

Referring to FIG. 8, the normal scanning operation of the scanning circuit of the embodiment 3 in FIG. 6 is now discussed. In the normal scanning mode, the clock $\phi$ 3 remains low level, and the third clocked inverter thus remains inactive. Now operative are the first and second stages of first shift register units 11-1 and 11-2, each constructed of the first and second clocked inverters 10-1, 10-2. When a high level of the starting pulse $\phi$ ST having a duration equal to one period of the clock $\phi$ 1 is applied at the node SR 0.0 at time $t_{ST}$, the high level output appears thereafter at each of the nodes SR 1.0, SR 20, SR 3.0, SR 4.0, SR 5.0, SR 6.0, SR 7.0, and SR 8.0 at times $t_{01}$, $t_{02}$, $t_{03}$, $t_{04}$, $t_{05}$, $t_{06}$, $t_{07}$, and $t_{08}$, respectively, according to the clocks $\phi$ 1 and $\phi$ 2.

Figure 9:
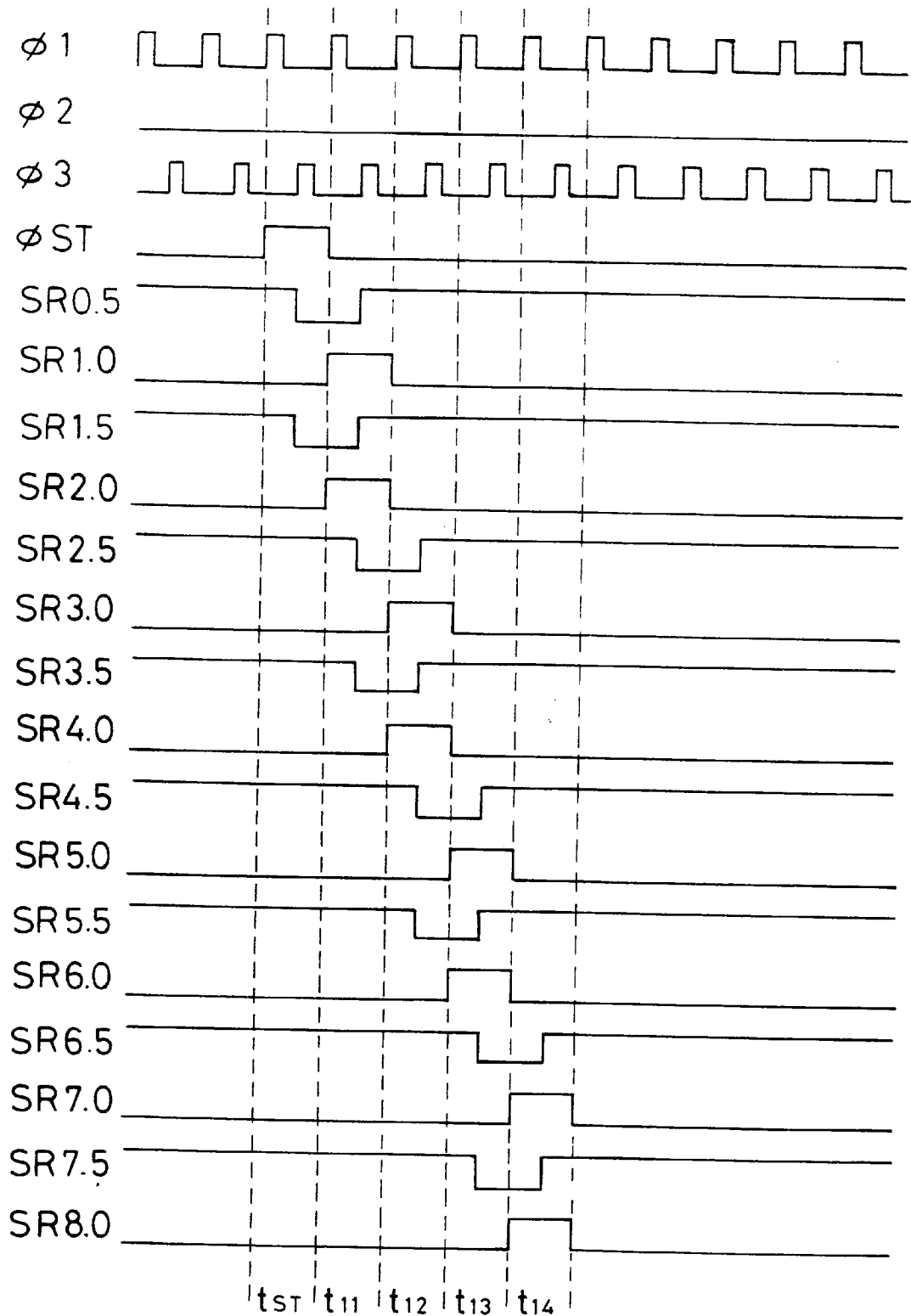
FIG. 9 is a timing diagram illustrating the operation of the scanning circuit of FIG. 6 in its thinned-out scanning mode.

The thinned-out scanning operation is now discussed referring to the timing diagram in FIG. 9. In the thinned-out scanning mode, the clock $\phi$ 2 remains low, and the first clocked inverters 10-1 thus remain inactive. When a high level of the pulse $\phi$ ST having a duration equal to one period of the clock $\phi$ 1 is applied at the node SR 0.0 at time $t_{ST}$, the third clocked inverter 12 turns active at a high level of the clock $\phi$ 3. The inverted $\phi$ ST signal is concurrently applied to nodes SR 0.5 and SR 1.5. At the moment the clock $\phi$ 1 turns high level at time $t_{11}$, the high level signal is transferred to nodes SR 1.0 and SR 2.0. In succession, the high level signal is sequentially transferred to nodes SR 3.0 and SR 4.0 at time $t_{12}$, to nodes SR 5.0 and SR 6.0 at time $t_{13}$, and to nodes SR 7.0 and SR 8.0 at time $t_{14}$.

The scanning circuit in FIG. 6 in its thinned-out scanning mode performs shift register operation with the two first shift register units 11-1 and 11-2 as a unit. In the same way as the embodiment 1, by connecting the output terminal of the third clocked inverter 12 to the first shift register units at n unit stages (n is 2 or greater integer) respectively, the scanning circuit operates as a shift register with n first shift register units as a unit. In this embodiment, the shift register is of a clocked inverter type. Any other alternative arrangement is acceptable as long as it transfers data according to a clock.

According to this embodiment, the clocked inverters that must be operative in the thinned-out scanning mode are the second and third clocked inverters 10-2 and 12 rather than the first clocked inverters 10-1. The clock frequency needs not be changed between the normal scanning mode and the thinned-out scanning mode. The thinned-out scanning mode thus requires no increased consumption power.

Figure 10:
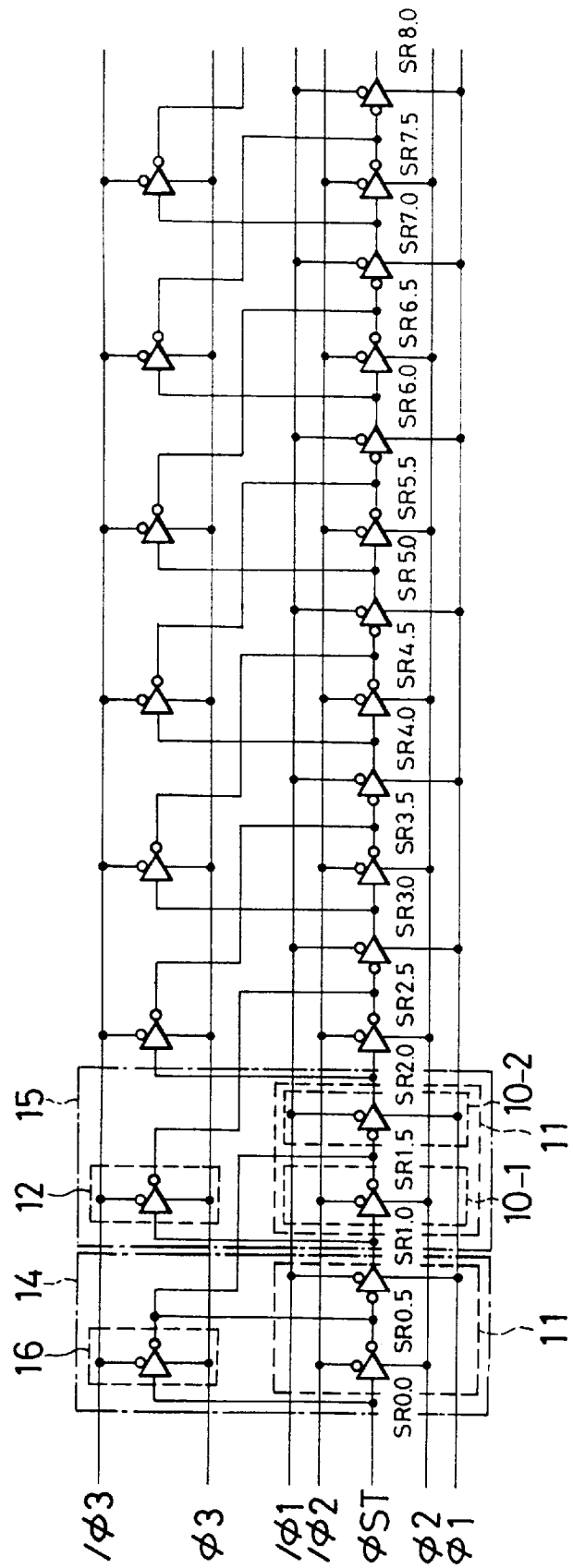
FIG. 10 is a schematic diagram showing the construction of the scanning circuit in an embodiment 4 of the present invention.

Referring to FIG. 10, a specific arrangement of the embodiment 2, referred to as the embodiment 4, is discussed. In FIG. 10, components equivalent to those with reference to the embodiment 3 in FIG. 6 are designated with the same reference numerals. There are shown first shift register units 11, a first unit stage 14, subsequent rightward (rearward) unit stages 15, and a third clocked inverter 16 at the first unit stage 14. At the first unit stage 14, the input terminal of the third clocked inverter 16 is connected to the input terminal of the first clocked inverter 10-1 that constitutes the first shift register unit 11. The output of the third clocked inverter 16 is connected to the input terminals of the second clocked inverters 10-2 of first shift register units 11 of the first and second unit stages, respectively.

Each of the second and subsequent rightward (rearward) unit stages 15 comprises a first shift register unit 11 constructed of the first and second clocked inverters 10-1 and 10-2 in a cascade. The input terminal of the first shift register unit 11 at an n-th unit stage is connected to the input terminal of the third clocked inverter 12 at the n-th unit stage. The output terminal of the third clocked inverter 12 at the n-th unit stage is connected to the input terminal of the second clocked inverter 10-2 at an (n+1)-th unit stage. The first unit stage 14 and a plurality of subsequent rightward (rearward) unit stages 15 are cascaded to form the scanning circuit.

The first and second clocked inverters 10-1 and 10-2 are driven active by the high levels of the clocks φ 2 and φ 1, respectively. The third clocked inverters 12 and 16 are driven active when the clock φ 3 is high level. The embodiment 4 dispenses with components equivalent to the first and second switches 3, 4 and the first stage switch 6 in the embodiment 2 shown in FIG. 5. In its inactive state, the clocked inverter has a large output impedance, isolating its output terminal from its input terminal, and thus functioning as a switch as well. In the embodiment shown in FIG. 10, the first unit stage 14 and seven subsequent unit stages 15 are cascaded.

The normal scanning mode of the scanning circuit of the embodiment 4 in FIG. 10 is now discussed. In the normal scanning mode, the clock φ 3 remains low level, and the third clocked inverters 12 and 16 are thus inactive. Now operative are the cascaded first shift register units 11 only to which the clocks φ 1 and φ 2 are applied. The scanning circuit operates as illustrated by the timing diagram in FIG. 8 in the same way the embodiment 3 operates in the normal scanning mode.

In the thinned-out scanning modes the scanning circuit operates as illustrated by the timing diagram in FIG. 9 in the same way the embodiment 3 operates. Specifically, since the clock φ 2 is low level, the first clocked inverters 10-1 are inactive. When a high level of the pulse φ ST having a duration equal to one period of the clock φ 1 is applied at the node SR 0.0 at time $t_{ST}$, the third clocked inverter 16 at the first unit stage 14 becomes active at a high level of the clock φ 3. The inverted φ ST is transferred to nodes SR 0.5 and SR 1.5. At the moment the clock φ 1 turns high level at time $t_{11}$, the high level signal is transferred to nodes SR 1.0 and SR 2.0. In succession, the high level signal is sequentially transferred to nodes SR 3.0 and SR 4.0 at time $t_{12}$, to nodes SR 5.0 and SR 6.0 at time $t_{13}$, and to nodes SR 7.0 and SR 8.0 at time $t_{14}$.

As described above, in the thinned-out scanning, the embodiment 4 in FIG. 10 works as a shift register with two stages of first shift register units 1 as a unit. In the same way as the embodiment 2, on the subsequent rightward unit stages, the output terminal of the third clocked inverter at a subsequent unit stage is connected to the input terminal of the second clocked inverter in the first shift register unit that is positioned rightward (rearward) by n unit stages from the first shift register unit to which the input of the third clocked inverter is connected. The output of the third clocked inverter at the first unit stage is connected commonly to the input terminals of the second clocked inverters from the first shift register unit which is connected to the input terminal of the third clocked inverter at the first unit stage, to the first shift register unit of the n-th unit stage. Thus, (n+1) stages of first shift register units are allowed to work as a unit in the operation of shift register. In this embodiment, the shift register is of a clocked inverter type. Any other alternative arrangement is acceptable as long as it transfers data according to a clock.

According to this embodiment, the clocked inverters that must be operative in the thinned-out scanning mode are the second and third clocked inverters and the first clocked inverters need not be operative. The clock frequency needs not be changed between the normal scanning mode and the thinned-out scanning mode. The thinned-out scanning mode thus requires no increased consumption power.

In the embodiments 3 and 4, when the high level signal appearing at each of nodes SR 1.0, SR 2.0, SR 3.0, SR 4.0, SR 5.0, SR 6.0, SR 7.0 and SR 8.0 is used as a selection signal, the selection signal is simultaneously output at two nodes in the thinned-out scanning mode. For example, in the embodiment 3, the selection signal appears at nodes SR 5.0 and SR 6.0 at time $t_{13}$ as shown in FIG. 9. If such a scanning circuit as this embodiment is used in a solid-state image pickup apparatus, two selection signals are simultaneously output at two different positions, two pixels are concurrently selected, and signals from the two pixels are simultaneously output.

Figure 11:
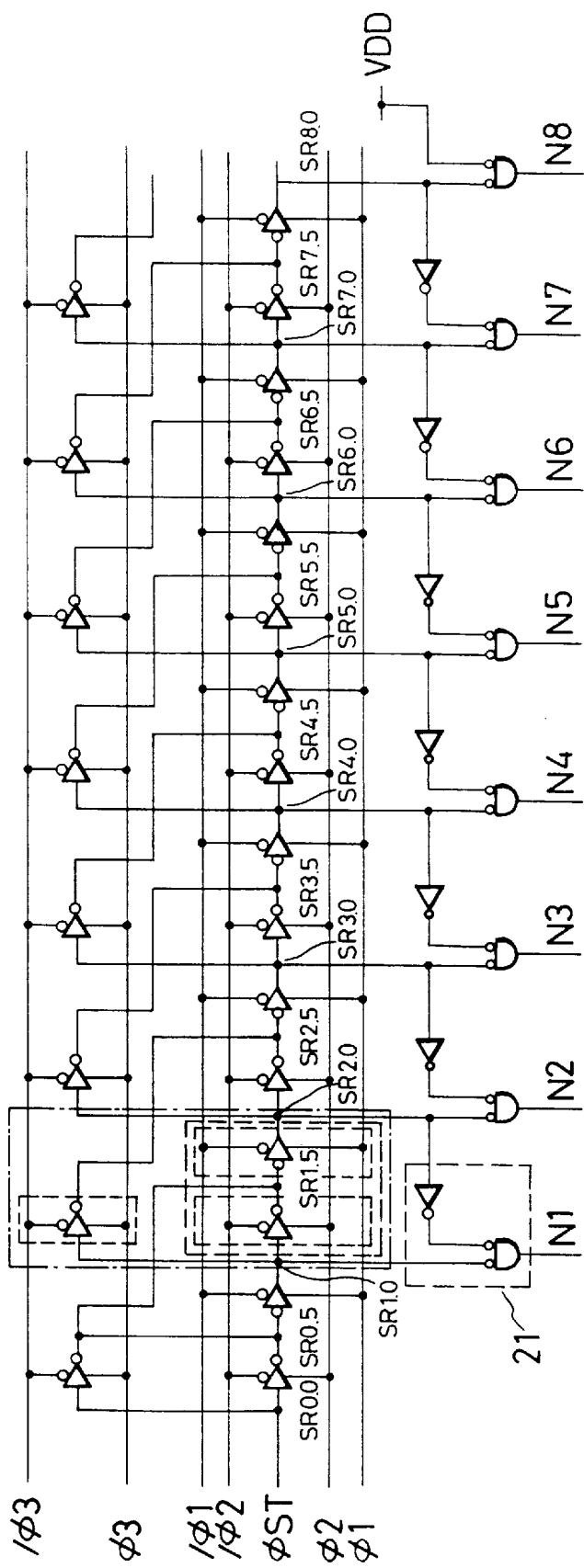
FIG. 11 is a schematic diagram showing the construction of the scanning circuit in an embodiment 5 of the present invention.
Figure 12:
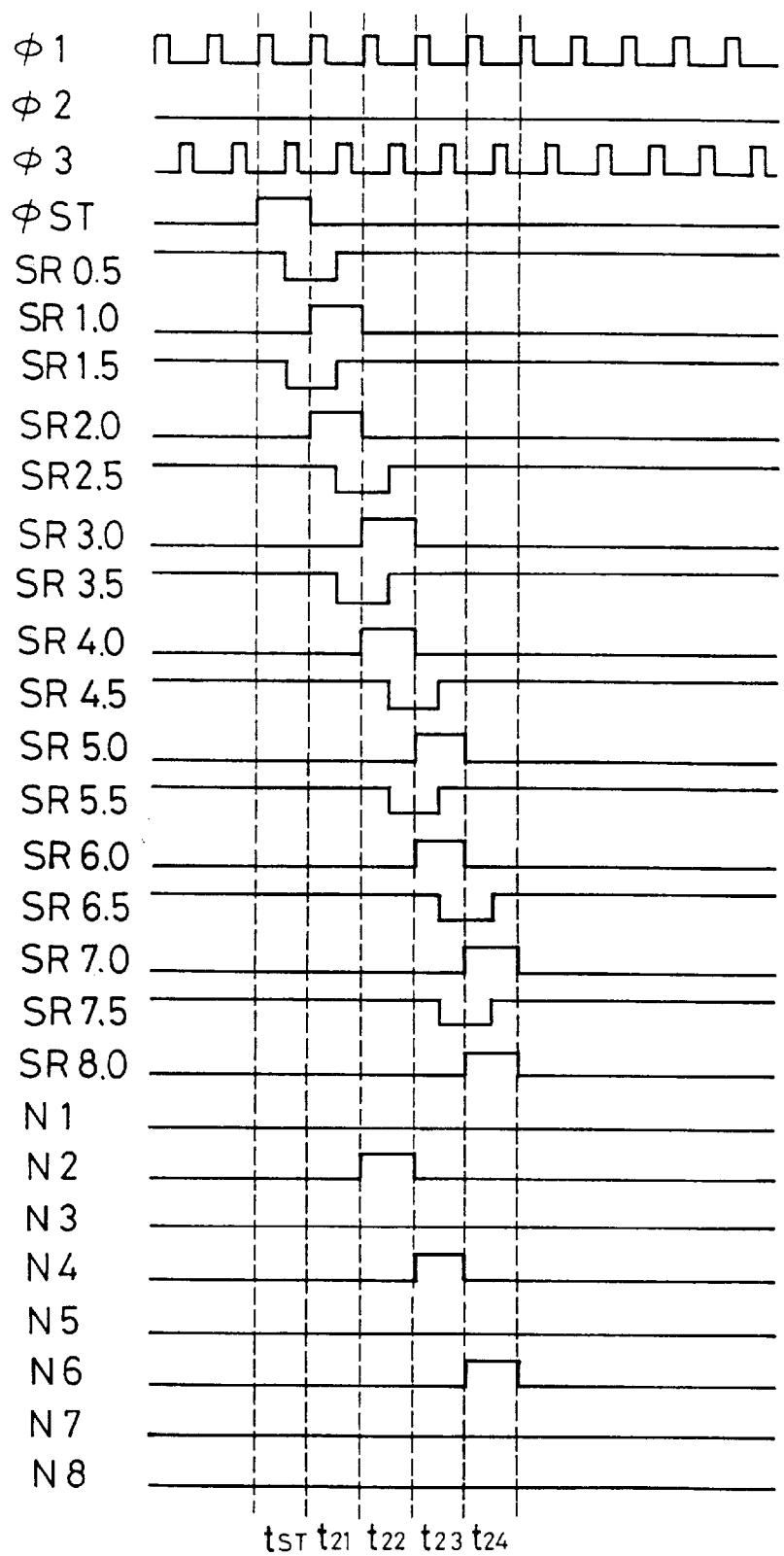
FIG. 12 is a timing diagram illustrating the scanning operation of the scanning circuit of FIG. 11.

In the embodiment 5 in FIG. 11, the embodiment 4 in FIG. 10 is additionally provided with a selection signal generating circuit 21 that generates NOR outputs of the outputs from a node SR n.0 (n=1, 2, 3, . . . ) and the inverted outputs from a node SR (n+1).0 of first shift register units. The output signal of an output node Nn of the selection signal generating circuit 21 is used as a selection signal. A high level signal appears at each node Nn when SR n.0 is low level and node SR (n+1).0 is high level. For example, when nodes SR 1.0, SR 2.0, SR 3.0, SR 4.0, SR 5.0, SR 6.0, SR 7.0, and SR 8.0 are respectively L (for a low level), L, L, L, H (for a high level), H, L, and L at time $t_23$ in the timing diagram in FIG. 12, nodes N1, N2, N3, N4, N5, N6, N7, and N8 become L, L, L, H, L, L, L, and L, respectively. Thus, a selection signal is output at node N4 only. In this embodiment, no selection signal is output at nodes N1, N3, and N5. A selection signal is sequentially output at nodes N2, N4, and N6 to perform the thinned-out scanning.

In this embodiment, one input terminal of the NOR gate for node N8 is coupled to VDD and thus fixed at a high level. The output of this NOR gate never turns high, and no selection signal is output at node N8. When the scanning circuit of this embodiment is incorporated in a solid-state image pickup apparatus, that scanning circuit has to include unit stages of which number is greater by 1 than the number of pixels to be selected.

Figure 1:
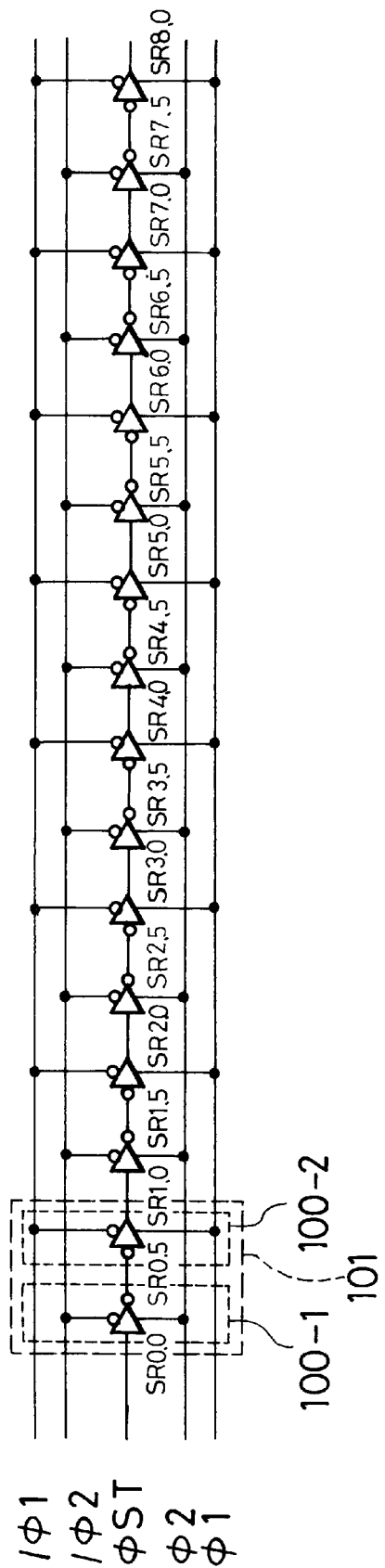
FIG. 1 is a schematic diagram showing the construction of the shift register of the scanning circuit in the prior art solid-state image pickup apparatus
Figure 2:
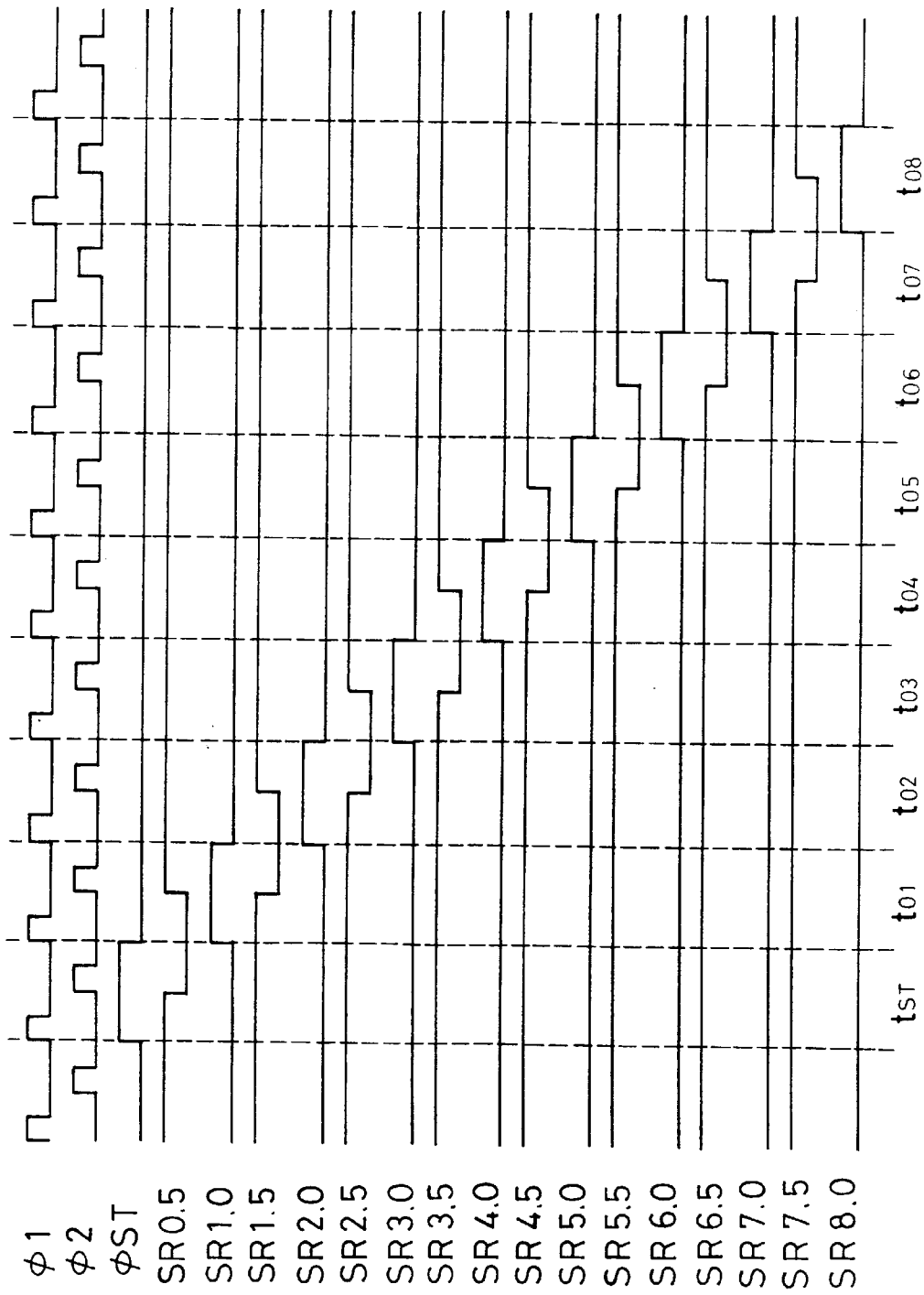
FIG. 2 is a timing diagram illustrating the operation of the shift register of FIG. 1 in its normal scanning mode.
Figure 3:
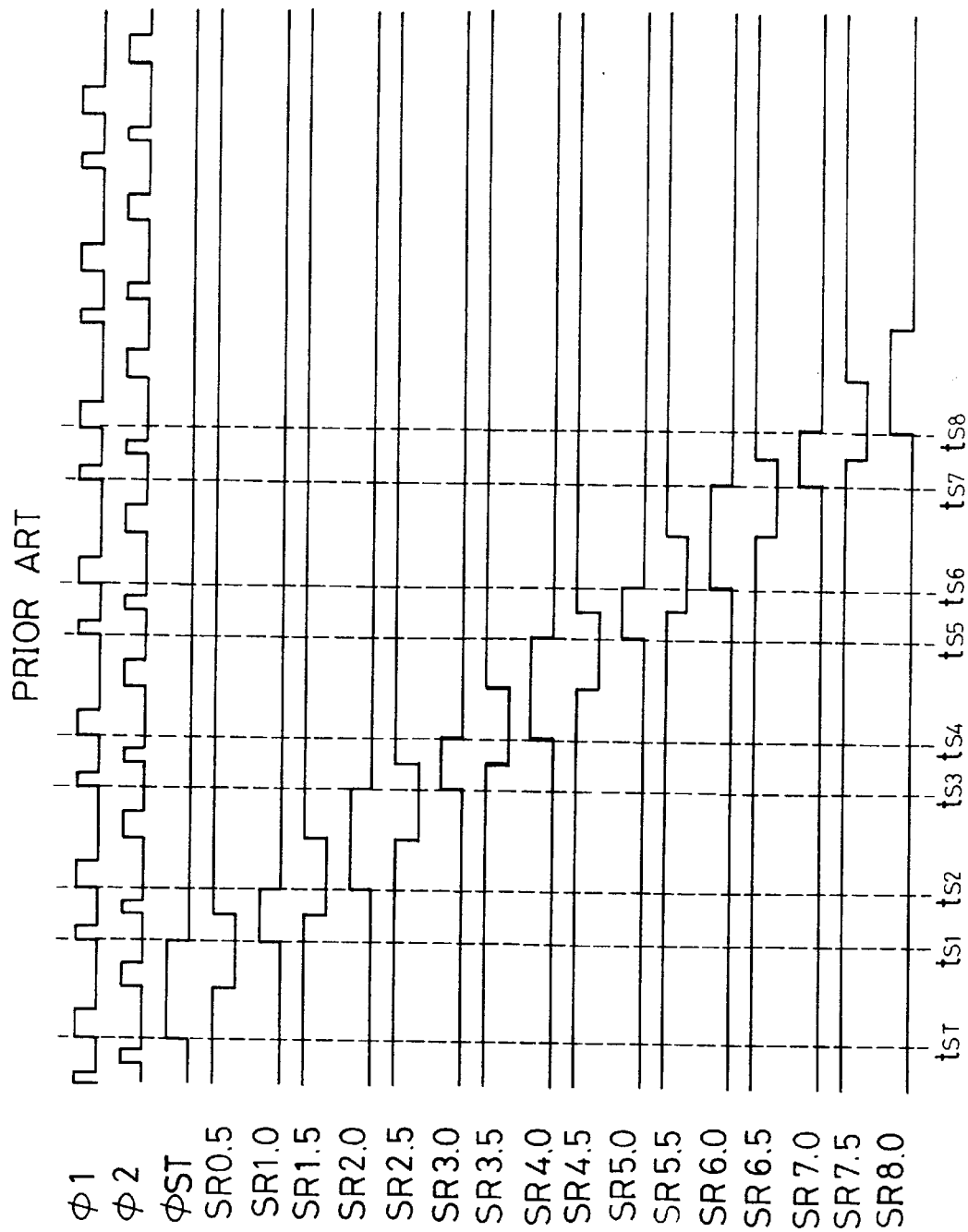
FIG. 3 is a timing diagram illustrating the operation of the shift register of FIG. 1 in its thinned-out scanning mode.

The selection signal is output at a single position by picking up the difference between the output at any given node and the output of the node one unit stage to the right (rear) from the given node, and no particular requirements are imposed on the construction of the selection signal generating circuit. The selection signal generating circuit may be constructed of a combination of NAND gates and inverters. In this embodiment, the selection signal is produced by the output from a given node and the output from the node one unit stage to the right (rear). Alternatively, the selection signal may be produced by the output from a given node and the output from the node one unit stage to the left (front). Although in this embodiment, the scanning circuit to which the selection signal generating circuit is added is the one in the embodiment 4, the scanning circuit in FIG. 3, if with the selection signal generating circuit added, equally works. Like embodiments 3 and 4, this embodiment has no limitation in the number of thinned-out stages.

In embodiments 3, 4 and 5, the third clocked inverter works as the first and second switches and the first stage switch for the thinned-out scanning described in embodiments 1 and 2. It is perfectly acceptable in embodiments 3, 4 and 5 that the first and second switch and the first stage switch for the thinned-out scanning are included.

Figure 13:
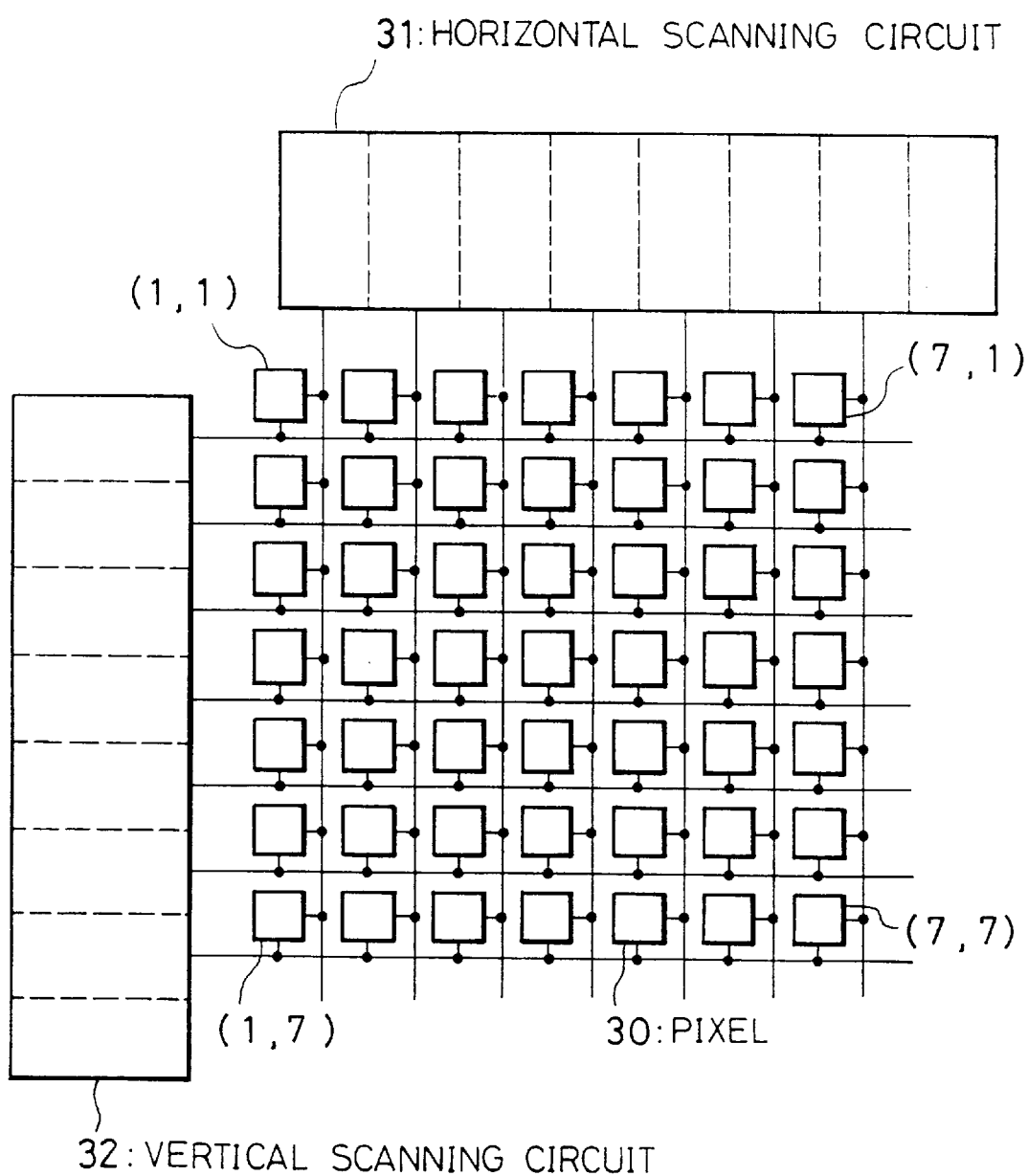
FIG. 13 is a block diagram showing an embodiment 6 of the present invention.

Described next referring to FIG. 13 is the embodiment 6 of a solid-state image pickup apparatus in which the scanning circuits described in the preceding embodiments are used as horizontal and vertical scanning circuits. In FIG. 13, a pixel array 30 is constructed 7× 7 pixels. In a notation (i,j) representing a pixel, i means a column number from left to right, namely, 1, 2, . . . , 7, and j means a row number from top to bottom, namely 1, 2, . . . , 7. Designated 31 and 32 are horizontal and vertical scanning circuits, respectively, employing the scanning circuit described in any of the embodiments 3, 4 and 5. Pixels selected by the vertical scanning circuit 32 are selected sequentially by the horizontal scanning circuit 31. At any given time, a signal is read from a pixel selected by both scanning circuits.

Figure 14:
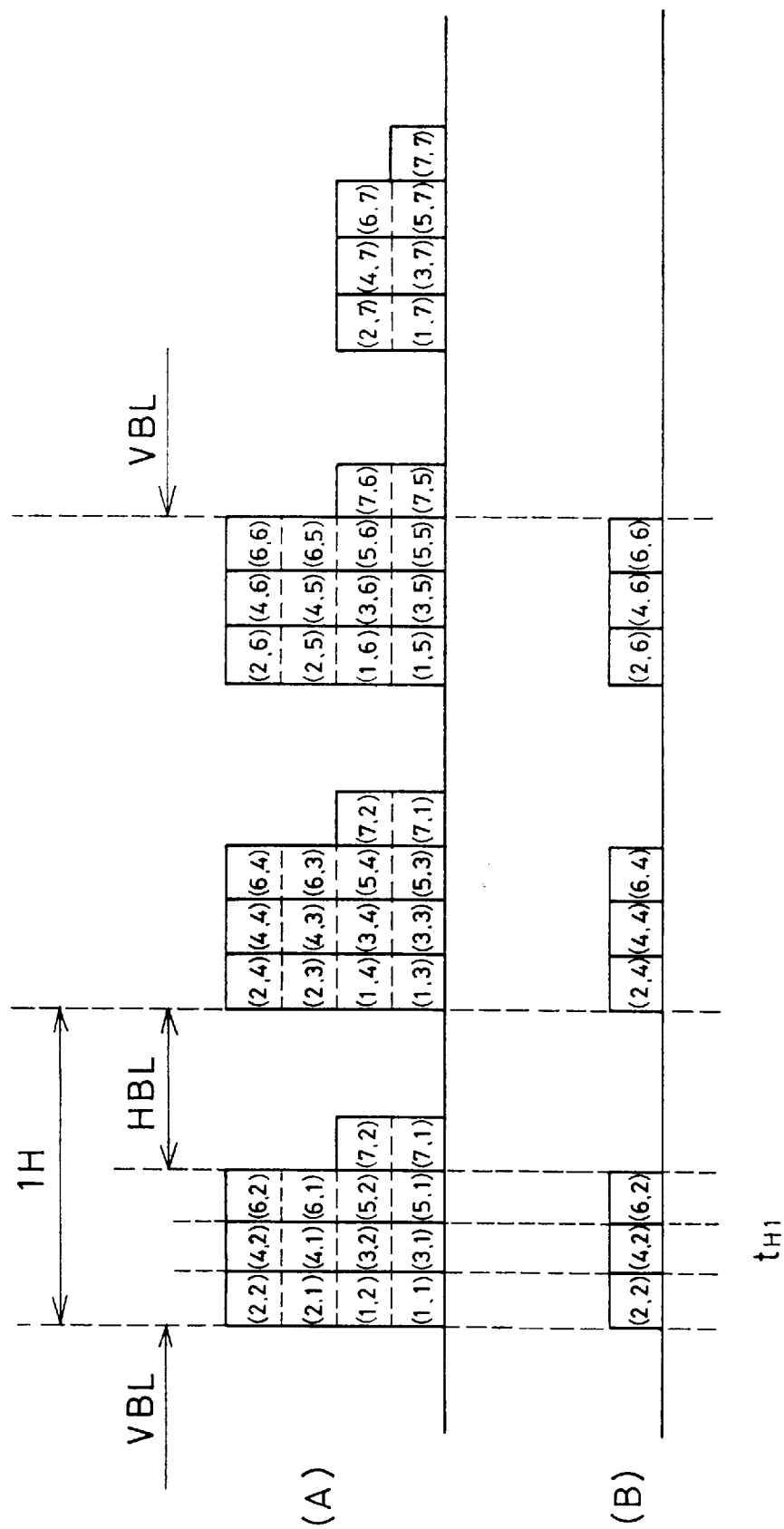
FIG. 14 is a timing diagram illustrating the operation of the embodiment 6 of the present invention.

Discussed below referring to the timing diagram (A) in FIG. 14 is the thinned-out scanning of the solid-state image pickup apparatus, wherein the scanning circuit of embodiment 3 or 4 are used as its horizontal and vertical scanning circuits. In FIG. 14, the abscissa represents time, and the ordinate represents the outputs of pixels. With the scanning circuits of embodiment 3 or 4 employed as the horizontal and vertical circuits, in the thinned-out scanning columns i=1 and 2 are selected at a time in the horizontal direction. In succession, columns i=3 and 4, columns i=5 and 6, and columns i=7 and 8 as a unit are sequentially selected. In the vertical direction of the pixels, rows j=1 and 2, rows j=3 and 4, rows j=5 and 6, and rows j=7 and 8 are sequentially selected. For example, at time $t_{H1}$, four pixels (3,1), (3,2), (4,1) and (4,2) are concurrently selected, and signals from these four pixels are read out. In this thinned-out scanning, the selection process of pixel is performed so that two pixels in the horizontal direction and two pixels in the vertical direction are selected. At any time, the readout of signal from four pixels is performed.

Discussed below referring to the timing diagram (B) in FIG. 14 is the thinned-out scanning of the solid-state image pickup apparatus, wherein the scanning circuit of embodiment 5 in FIG. 11 is used as its horizontal and vertical scanning circuits. In the thinned-out scanning, selection signals are given in columns i=2, 4, and 6 in the horizontal direction and in rows j=2, 4, and 6 in the vertical direction. Thus, at time $t_{H1}$, pixel (4,2) is selected for reading. In this thinned-out scanning, one pixel out of every two pixels is read for signal in both horizontal and vertical directions. In FIG. 14, 1H presents a horizontal scanning period, HBL a horizontal blanking period, and VBL a vertical blanking period.

In this embodiment, two pixels are handled as a unit in the horizontal and vertical directions. As already stated in the discussion of embodiments 3, 4, and 5, no limitation is imposed on the number of thinned-out stages. In the discussion herein, the pixel array is 7×7. The number of pixels in use is not limited to this. In this embodiment, the shift registers concurrently perform the thinned-out scanning in both the horizontal and vertical directions However, it is perfectly acceptable that a single-direction thinned-out scanning is performed by allowing either the horizontal or vertical scanning circuit to carry out the thinned-out scanning.

The embodiment 7 is now discussed. Generally, solid-state image pickup apparatus makes OB (optical black) clamp in an effort to perform a stable imaging against variations in service environments, such as ambient temperature changes. To carry out OB clamp, an OB pixel (light shielding pixel) is arranged on the periphery of the light receiving pixels, and a signal is read from the OB pixel during the horizontal blanking period or vertical blanking period. Typically, a plurality of OB pixels are disposed.

The method of reading the OB pixels for performing the prior art OB clamp involves reading all pixels sequentially For example, assuming a horizontal driving frequency of 10 MHz over 20 OB pixels arranged in the horizontal scanning direction, a read time for the OB pixels per a horizontal scan is 20÷10 MHz=2 μs.

In the thinned-out scanning, the read time for OB pixels is shortened For example, in the thinned-out scanning where one every four pixels is selected for signal readout, the OB read time per a horizontal scan is shortened 20÷10 MHz÷4= 0.5 μs. This adversely affects the stability of OB clamp operation In the practical readout of the OB pixels, OB pixel signals from OB pixels bordering the light receiving pixels suffer an insufficient light shielding effect. Thus, some pixels on the border are not used for clamping operation in practice, and the OB read time is shortened even further.

Figure 15:
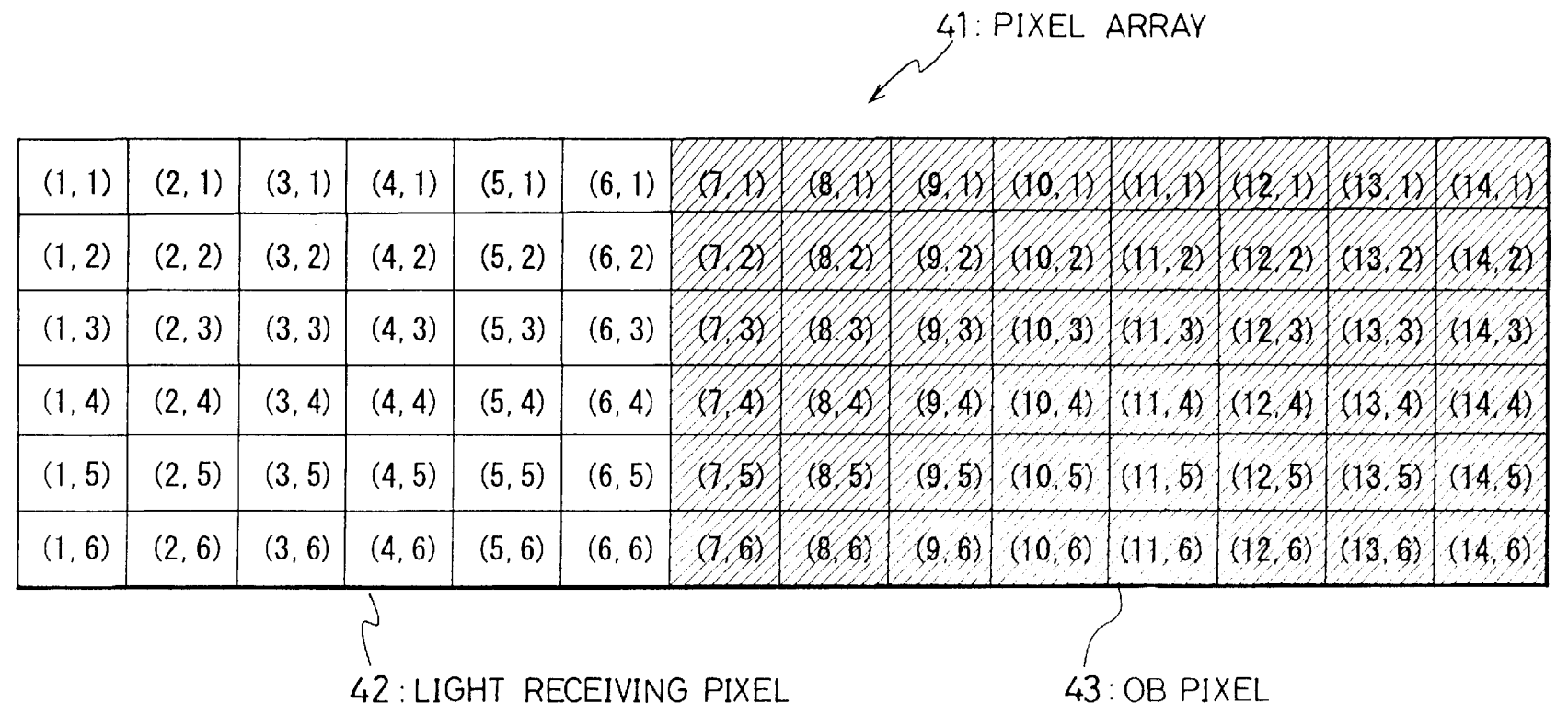

The embodiment 7 resolves the above problem that arises when the thinned-out technique is implemented in the solid-state image pickup apparatus having OB pixels. FIG. 15 shows the organization of the pixel array 41 of the embodiment 7 which is two-dimensionally arranged. The pixel array 41 is an array of pixels in 14 columns by 6 rows. Each pixel (i,j) is arranged from left to right i=1, 2, 3, . . . , 14 in the horizontal direction and from top to bottom j=2, 3 . . . , 6 in the vertical direction Hatched pixels at columns i=7, . . . , 14 are OB pixels 43, and the remaining pixels are light receiving pixels 42. In this embodiment, the number of OB pixels is doubled in the columns compared with the pixel array of the solid-state image pickup apparatus that performs the normal scanning only.

Figure 16:
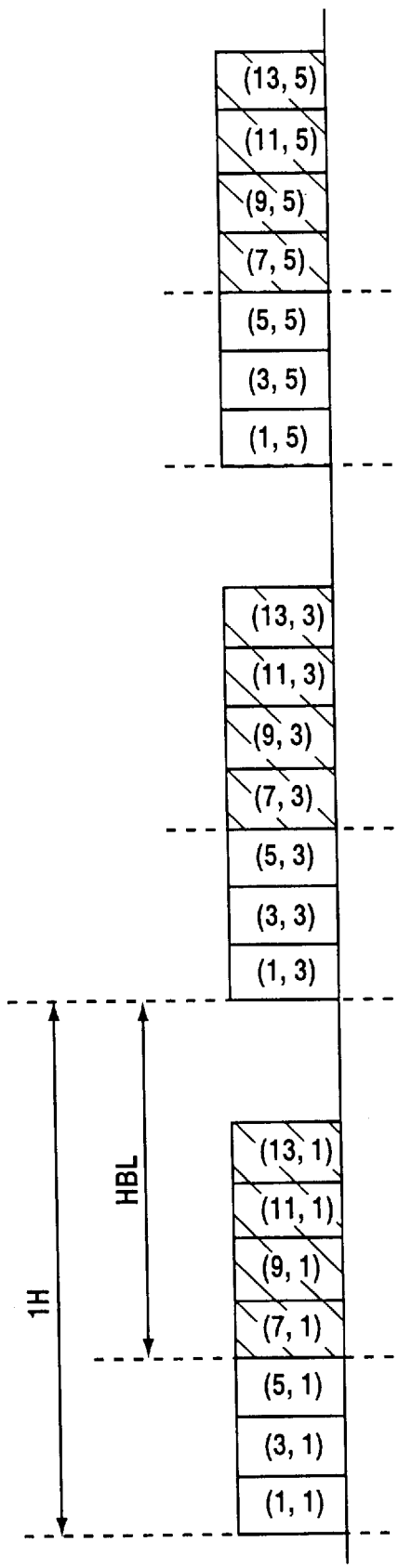
FIG. 16 is a timing diagram illustrating the operation which reads the pixel array of FIG. 15 in its thinned-out scanning mode.

FIG. 16 is the timing diagram of the signal which the solid-state image pickup apparatus having the pixel array 41 in FIG. 15 reads from one every two pixels in thinned-out scanning. In connection with the first row, light receiving pixels (1,1), (3,1), and (5,1) are read, and in succession, four OB pixels (7,1), (9,1), (11,1) and (13,1) are read during the horizontal blanking period. In this way, by increasing the OB pixels, rather than by employing means for varying the driving frequency of the scanning circuit, the image pickup apparatus of this embodiment achieves in the thinned-out scanning the OB read time matched by the solid-state image pickup apparatus that performs the normal scanning only.

The thinned-out scanning mode of this embodiment is a ½ thinning-out, namely, one out of every two pixels is read for signal. Thus, the number of OB pixels is twice the number of those in the solid-state image pickup apparatus of normal scanning mode only type. The number OB pixels may be increased depending on the change in the number of thinned-out pixels.

The embodiment 7 employs increased OB pixels to achieve a sufficient OB read time long enough to perform OB clamping in both the normal scanning and thinned-out scanning modes. In this means, however, the increased number of pixels gives rise to an increased chip area, possibly leading to a lowered production yield. The embodiment 8 provides a sufficient OB reading capability in both modes without employing means of the embodiment 7.

FIG. 17 shows a pixel array 51 two-dimensionally arranged in the embodiment 8. The pixel array 51 is an array of pixels in 10 columns by 6 rows. Each pixel (i,j) is arranged from left to right i=1, 2, 3, . . . , 10 in the horizontal direction and from top to bottom j=1, 2, 3, . . . , 6 in the vertical direction. Hatched pixels at columns i=7, 8, 9, and 10 are OB pixels 53 to which an incident light is blocked, and the remaining pixels are light receiving pixels 52.

Figure 18:
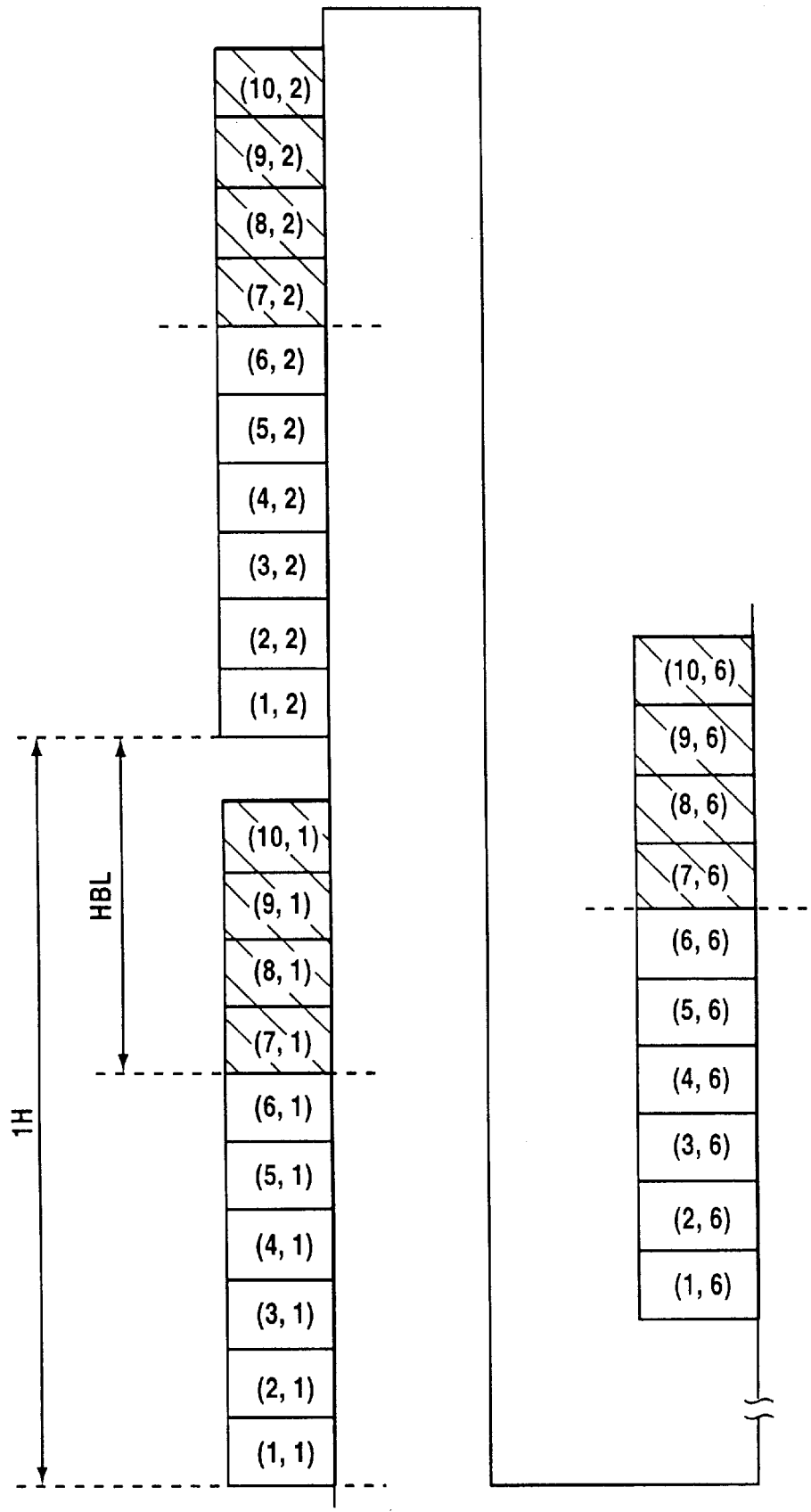
FIG. 18 is a timing diagram illustrating the operation which reads the pixel array of FIG. 17 in its normal scanning mode.

The solid-state image pickup apparatus produces the signal output shown in the timing diagram in FIG. 18 in the normal scanning mode in which all pixels arranged as in FIG. 17 are read. The abscissa represents time, and the ordinate represents pixel outputs in FIG. 18. For the initial horizontal scan period (1H), pixels (1,1), (2,1), (3,1), . . . at the top row j=1 are sequentially read starting with i=1, and then for the horizontal blanking period (HBL), OB pixels in i=7, 8, 9, and 10, namely, pixels (7,1), (8,1), (9,1) and (10,1) are read. At the next horizontal scan, pixels at the second row of j=2 are read.

Figure 19:
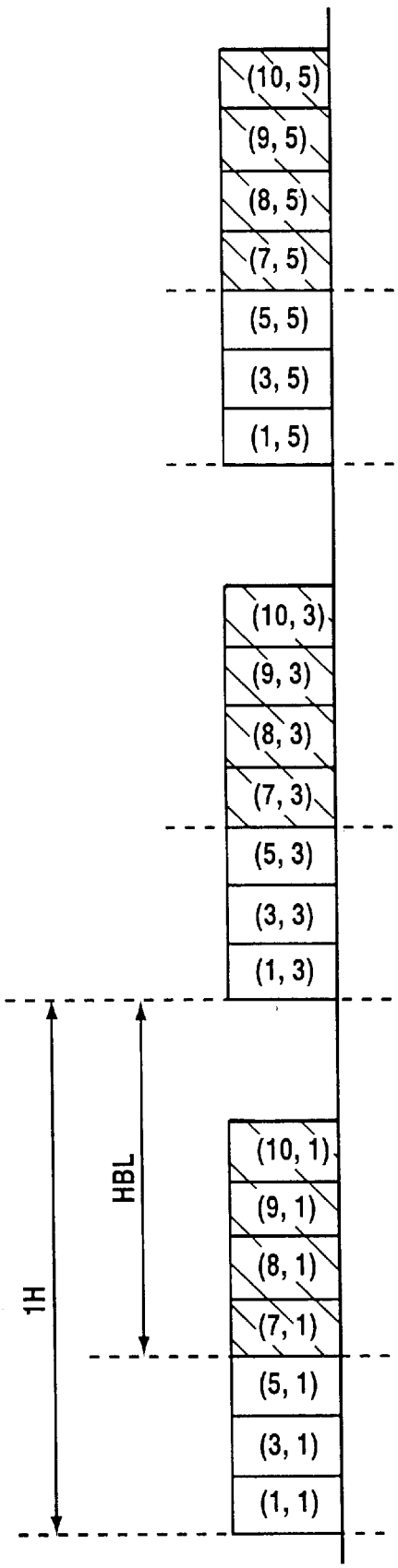
FIG. 19 is a timing diagram illustrating the operation which reads the pixel array of FIG. 17 in its thinned-out scanning mode.

In the thinned-out scanning mode for reading one out of every two pixels, the signal output in the timing diagram in FIG. 19 is obtained. Specifically, at the initial horizontal scan period, pixels i=1, 3, 5 at the top row j=1 are read for signal output in the thinned-out scanning mode , and then, for the horizontal blanking period, OB pixels at i=7, 8, 9, and 10, namely, pixels (7,1), (8,1), (9,1) and (10,1) are read in the same manner as the normal scanning mode. In the thinned-out scanning mode, the solid-state image pickup apparatus allows the OB pixels to scan in the same manner as in the normal scanning mode. In this way, a sufficient OB pixel signal is picked up to perform OB clamping in both the normal scanning mode and thinned-out scanning mode without the need for increasing the number of OB pixels and varying the driving frequency of the scanning circuit within scanning operation According to embodiments 7 and 8, OB pixel signal readout required for performing OB clamping is possible in the thinned-out scanning mode in the solid-state image pickup apparatus having the OB pixels. In the above discussion of embodiments 7 and 8, the thinned-out scanning mode is a ½ thinning-out, namely one out of every two pixels is read for signal There is no particular limitation to the rate of thinning-out The number of pixels in the pixel array is not limited to 14 columns by 6 rows in FIG. 15 and 10 columns by 6 rows in FIG. 17. In embodiments 7 and 8, the OB pixels are arranged in the rear end of the horizontal scan. Alternatively, the OB pixels may be arranged in the front end of the horizontal scan In this case, the readout of the OB pixels is performed in the horizontal blanking period prior to the readout of the light receiving pixels. If the OB pixels are arranged either in the front end of the vertical scan or in the rear end of the vertical scan, the vertical scan in place of the horizontal scan is considered for OB pixel reading in embodiments 7 and 8.

In the above-described embodiments 7 and 8, the shortening of the read time of the OB pixels is precluded in the thinned-out scanning mode without varying the driving frequency of the scanning circuit. Discussed next is the thinned-out scanning method in the solid-state image pickup apparatus that have the pixel array including the OB pixels and the scanning circuits being possible to change the driving frequency.

Figure 20:
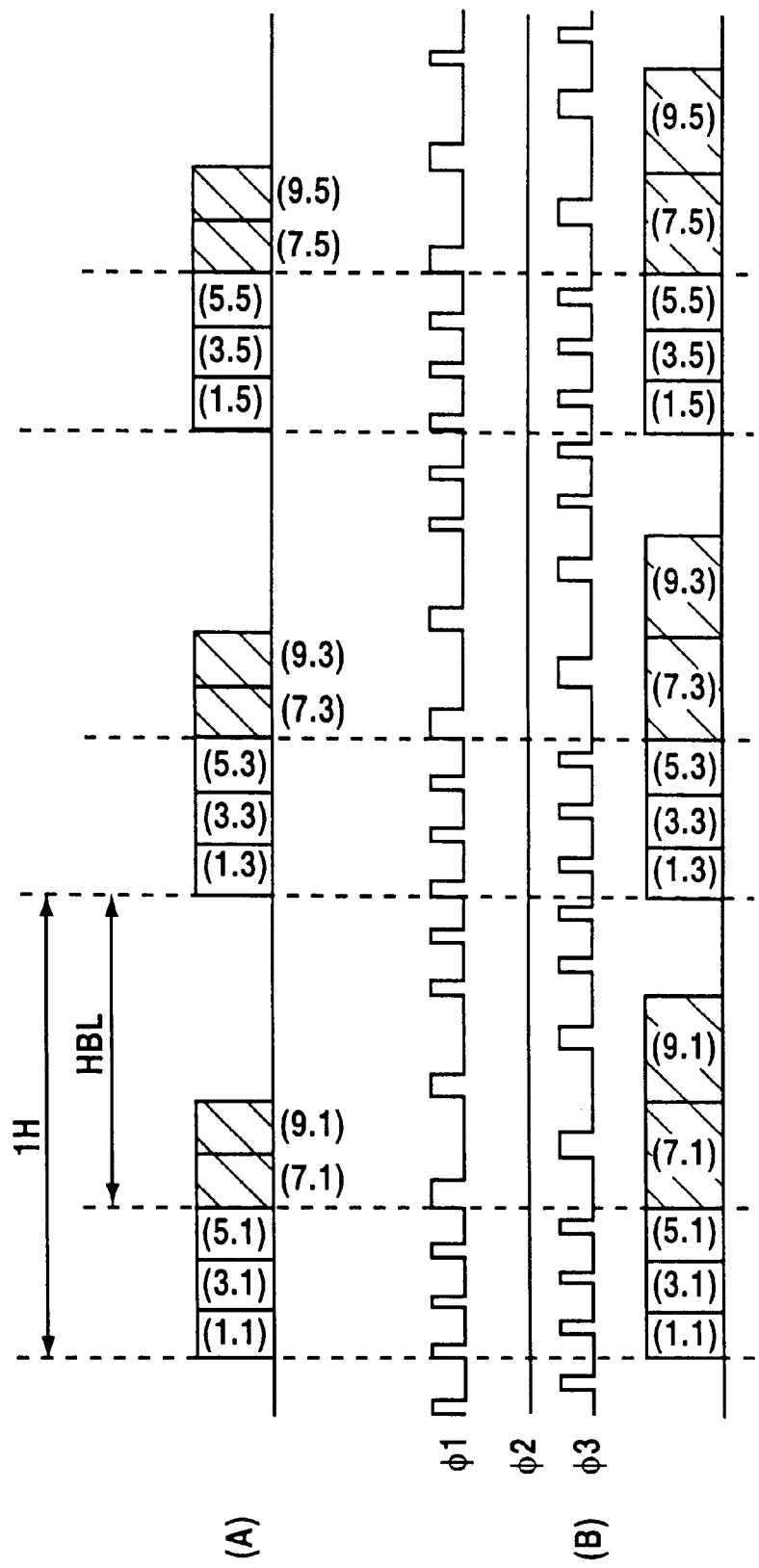
FIG. 20 is a timing diagram illustrating the operation which reads the pixel array in the thinned-out scanning mode, wherein the scanning circuit is capable of changing its driving frequency within scanning in the solid-state image pickup apparatus having the pixel array of FIG. 17.

In the thinned-out scanning mode in which one out of every two pixels is read, the solid-state image pickup apparatus having the pixel array including the OB pixels as shown in FIG. 17 gives the output shown in the timing diagram (A) in FIG. 20 if the same driving frequency as the normal scanning mode is used in the thinned-out scanning mode. The OB pixels read time is half of that for the normal scanning mode. This forces OB clamping operation to be completed in a shorter period of time than in the normal scanning mode, possibly leading to an insufficient OB clamping.

As shown in timing diagram (B) in FIG. 20, the driving frequency is lowered to be half as high as that for the light receiving pixels during the OB pixel scanning within the horizontal blanking period HBL, and thus the OB pixel read time is kept equal to that for the normal scanning mode. In the timing diagram (B) in FIG. 20, $\phi$ 1, $\phi$ 2 and $\phi$ 3 are driving clocks when the scanning circuit of the embodiment 5 in FIG. 11 is used. Since the scanning circuit now performs the thinned-out scanning, clocks $\phi$ 1 and $\phi$ 3 are used. To read the OB pixels i=7, 9 during the horizontal blanking period, the frequency of clocks $\phi$ 1 and $\phi$ 3 is half of the clock frequency used to read light receiving pixels i=1~5. Since in this embodiment, the thinned-out scanning performs a ½ thinning-out, in which one out of every two pixels is read, the driving frequency of the OB pixels is half of the driving frequency of the light receiving pixels. The degree of lowering the driving frequency may be determined depending on the number of OB pixels. In this case, however, the phase relationship between clocks must remain fixed.

In the solid-state image pickup apparatus having the pixel array shown in FIG. 15, the OB pixel read time is prolonged in the normal scanning mode depending on the degree of increase in the number of OB pixels. The reading of all OB pixels should be completed within the horizontal blanking period (HBL) in the normal scanning mode. There is a fear that increased number of OB pixels makes it impossible to read all OB pixels within the horizontal blanking periods As shown in the timing diagram (A) in FIG. 21, the driving frequency may be doubled during the OB pixel scan within the horizontal blanking period so that the OB pixel read time is set to be equal to that in the thinned-out scanning mode. In the timing diagram (A) in FIG. 21, $\phi$ 1, $\phi$ 2 and $\phi$ 3 are driving clocks when the scanning circuit of the embodiment 5 in FIG. 11 is used. Since the scanning circuit now performs the normal scanning, clocks $\phi$ 1 and $\phi$ 2 are used, To read the OB pixels i=7~14 during the horizontal blanking period, the frequency of clocks φ 1 and φ 2 is twice of the clock frequency used to read light receiving pixels i~16. Since in this embodiment, the thinned-out scanning performs a ½ thinning-out with one out of every two pixels being read, the number of OB pixels is twice that of the solid-state image pickup apparatus of a normal scanning mode only type; thus, the driving frequency of the OB pixels is twice as high as the driving frequency of the light receiving pixels. The degree of raising the driving frequency may be determined depending on the number of thinned-out pixels and the number of OB pixels. In this case, however, the phase relationship between clocks must remain fixed.

Figure 21:
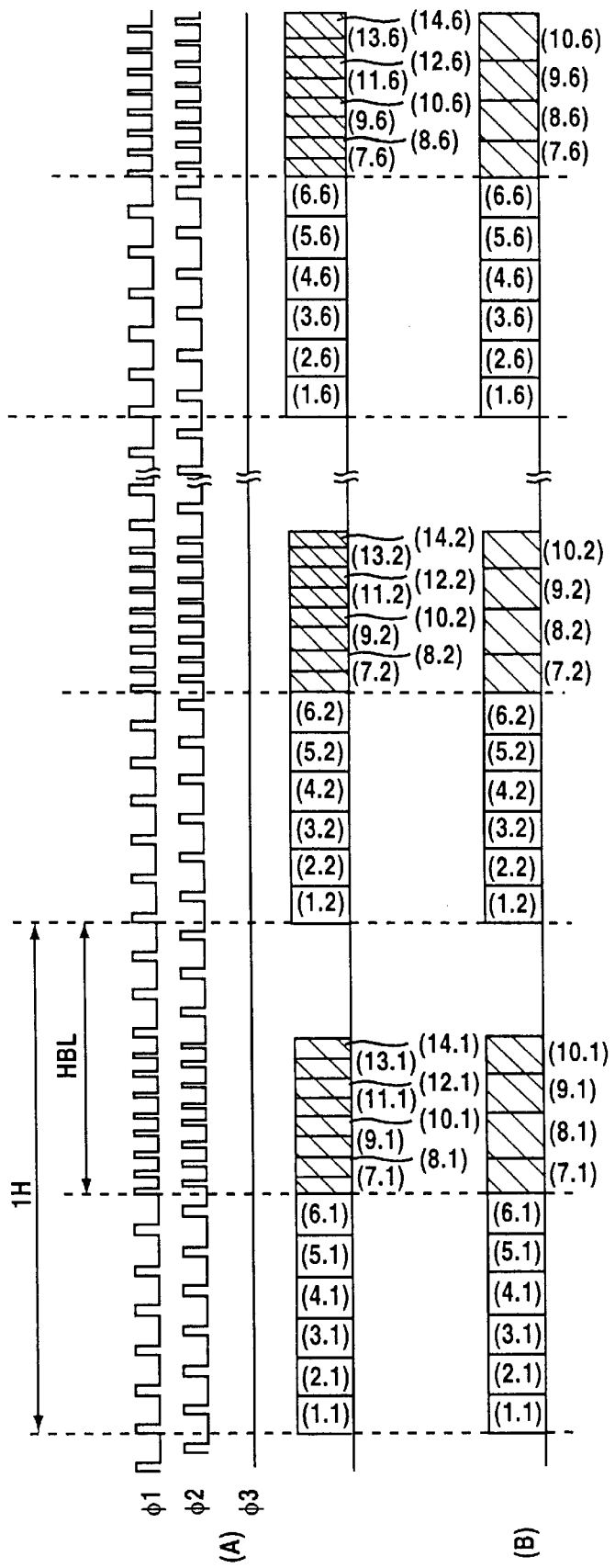
FIG. 21 is a timing diagram illustrating the operation which reads OB (optical black) pixels in the normal scanning mode in the solid-state image pickup apparatus having the pixel array of FIG. 15.

In the timing diagram (A) in FIG. 21, the driving frequency of the solid-state image pickup apparatus needs to be changed to read the OB pixels in the normal scanning mode, and thus controlling of the scanning circuit becomes complex To avoid such complexity, the reading of the OB pixels is suspended midway in the normal scanning mode as shown in the timing diagram (B) in FIG. 21. In the timing diagram (B) in FIG. 21, the reading of the first row is suspended at the moment OB pixel (10,1) has been just read. The second and subsequent rows are read similarly. The midway suspension of the scanning is disclosed in detail in Japanese Unexamined Patent Publication No. 6-338198.

In the normal scanning mode, as shown in the timing diagram (B) in FIG. 21, the midway suspension of the reading of the OB pixels makes it unnecessary for the solid-state image pickup apparatus to change its frequency midway even when the increased number of OB pixels presents difficulty reading all OB pixels within the horizontal blanking period.

As described in connection with embodiment 6, the method of reading the OB pixels in embodiments 7 and 8 is implemented in not only solid-state image pickup apparatuses having the scanning circuit of embodiments 1~5 but also common solid-state image pickup apparatuses that perform a thinned-out scanning with one out of every predetermined pixels being read or a predetermined stages handled as a unit in scanning.

According to the present invention, the solid-state image pickup apparatus performs the thinned-out scanning with no increased power consumption involved and without using a complex clock control than that for the normal scanning mode. When the thinned-out scanning technique is implemented in the solid-state image pickup apparatus having the pixel array including the OB pixels, it performs the thinned-out scanning without shortening the OB pixel read time.

What is claimed is:

1. An XY-address solid-state image pickup apparatus comprising:
    a pixel array made up a plurality of pixels two-dimensionally arranged,
    horizontal and vertical scanning circuits for reading a signal from the pixel array,
    each scanning circuit comprising a plurality of unit stages cascaded, each unit stage comprising a plurality of first shift register units cascaded and a single second shift register unit which is associated with the plurality of first shift register units and which is driven by a clock different from the clock that drives the plurality of first shift register units,
    said each unit stage further comprising a first switch and a second switch, whereby an input to the first unit of the first shift register units is also fed to the second shift register unit via the first switch, and an output of the second shift register unit is fed to each of the plurality of first register units within said unit stage via the second switch, and
    said each scanning circuit further comprising driving means for turning on/off the first and second switches in order to switch between a normal scanning and a thinned-out scanning.

2. An XY-address solid-state image pickup apparatus comprising:
    a pixel array made up a plurality of pixels two-dimensionally arranged,
    horizontal and vertical scanning circuits for reading a signal from the pixel array,
    each scanning circuit comprising a plurality of unit stages cascaded, each unit stage comprising a first shift register units and a second shift register unit which is associated with the first shift register unit and which is driven by a clock different from the clock that drives the first shift register unit,
    said each unit stage further comprising a first switch and a second switch, whereby an input to the first shift register unit is also fed to the second shift register unit associated with the first shift register unit via the first switch, and an output of the second shift register unit is fed to the first register unit at the unit stage that is rearward positioned by m (m is 1 or greater integer) unit stages via the second switch, and
    said each scanning circuit further comprising driving means for turning on/off the first and second switches in order to switch between a normal scanning and a thinned-out scanning.

3. An XY-address solid-state image pickup apparatus comprising:
    a pixel array made up a plurality of pixels two-dimensionally arranged,
    horizontal and vertical scanning circuits for reading a signal from the pixel array,
    each scanning circuit comprising a plurality of unit stages cascaded, each unit stage comprising a plurality of first shift register units cascaded and a single second shift register unit which is associated with the plurality of first shift register units and which is driven by a clock different from the clock that drives the plurality of first shift register units,
    said each first shift register unit being constructed of a first clocked inverter and a second clocked inverter cascaded and the single second shift register unit being constructed of a single clocked inverter, whereby an input to the first unit of the first shift register units is also fed to the second shift register unit, and an output of the second shift register unit is fed to each of the second clocked inverters in the plurality of first shift register units within said unit stage, and
    said each scanning circuit further comprising driving means for driving active or inactive each clocked inverter in the first and second shift register units in order to switch between a normal scanning and a thinned-out scanning.

4. An XY-address solid-state image pickup apparatus comprising:
    a pixel array made up a plurality of pixels two-dimensionally arranged,
    horizontal and vertical scanning circuits for reading a signal from the pixel array,
    each scanning circuit comprising a plurality of unit stages cascaded, each unit stage comprising a first shift register unit and a second shift register unit which is associated with the first shift register unit and which is driven by a clock different from the clock that drives the first shift register unit, each first shift register unit being constructed of a first clocked inverter and a second clocked inverter cascaded and the second shift register unit being constructed of a single clocked inverter, whereby an input to the first shift register unit is also fed to the second shift register unit, and an output of the second shift register unit is fed to the second clocked inverter that constitutes the first shift register unit at the unit stage that is rearward positioned by m (m is 1 or greater integer) unit stages, and said each scanning circuit further comprising driving means for driving active or inactive each clocked inverter in the first and second shift register units in order to switch between a normal scanning and a thinned-out scanning.

5. A solid-state image pickup apparatus according to any one of claims 1 through 4, wherein said each scanning circuit comprises means for outputting, as a selection signal, the difference signal between the outputs of adjacent first shift register units, and the selection signal is used to select and read the pixel array.

6. A solid-state image pickup apparatus according to any one of claims 1 through 4, wherein said pixel array comprises at least in part of the periphery portion of said array, light shielding pixels more than the number of light shielding pixels required for the normal scanning mode.

7. A solid-state image pickup apparatus according to claim 6, wherein the number of light shielding pixels in the pixel array is determined to match the thinning-out ratio in a thinned-out scanning mode.

8. A solid-state image pickup apparatus according to claim 6, wherein the horizontal scanning circuit reads the light shielding pixels faster than light receiving pixels in the normal scanning mode.

9. A solid-state image pickup apparatus according to claim 6, the horizontal scanning circuit suspends midway the reading of the light shielding pixels in the normal scanning mode.

10. A solid-state image pickup apparatus according to any one of claims 1 through 4, wherein said pixel array comprises light shielding pixels at least in part of the periphery portion of said array, and said each scanning circuit performs the normal scanning to the light shielding pixels only in the thinned-out scanning mode.

11. A solid-state image pickup apparatus according to any one of claims 1 through 4, wherein said pixel array comprises light shielding pixels at least in part of the periphery portion of said array, and said horizontal scanning circuit reads the light shielding pixels slower than light receiving pixels in the thinned-out scanning mode.

* * * * *